US009400192B1

(12) United States Patent
Salser, Jr. et al.

(10) Patent No.: US 9,400,192 B1
(45) Date of Patent: Jul. 26, 2016

(54) UNIVERSIAL AMR SYSTEM

(71) Applicants: Floyd Stanley Salser, Jr., Ocala, FL (US); Roger Allcorn, Newcastle (GB); Stevev Montgomery, Yukon, OK (US)

(72) Inventors: Floyd Stanley Salser, Jr., Ocala, FL (US); Roger Allcorn, Newcastle (GB); Stevev Montgomery, Yukon, OK (US)

( * ) Notice: Subject to any disclaimer, the term of this patent is extended or adjusted under 35 U.S.C. 154(b) by 374 days.

(21) Appl. No.: 14/108,314

(22) Filed: Dec. 16, 2013

Related U.S. Application Data

(63) Continuation-in-part of application No. 13/555,065, filed on Jul. 20, 2012, now Pat. No. 8,610,594, and a continuation-in-part of application No. 12/050,160, filed on Mar. 17, 2008, now Pat. No. 7,980,317, and a continuation of application No. 10/989,811, filed on Nov. 16, 2004, now Pat. No. 7,498,953, and a continuation-in-part of application No. 12/143,822, filed on Jun. 23, 2008, now Pat. No. 7,994,935, and a continuation-in-part of application No. 13/159,360, filed on Jun. 13, 2011, now Pat. No. 8,657,021, and a continuation-in-part of application No. 12/050,123, filed on Jun. 3, 2008, now abandoned, and a continuation-in-part of application No. 12/050,138, filed on Mar. 17, 2008, now Pat. No. 8,164,480.

(60) Provisional application No. 60/895,104, filed on Mar. 15, 2007.

(51) Int. Cl.
*G08B 23/00* (2006.01)
*G01D 4/00* (2006.01)

(52) U.S. Cl.
CPC .................................. *G01D 4/002* (2013.01)

(58) Field of Classification Search
CPC ........................................ G01D 4/002
USPC .................................... 340/870.02
See application file for complete search history.

(56) References Cited

U.S. PATENT DOCUMENTS

| | | | | |
|---|---|---|---|---|
| 5,461,558 A * | 10/1995 | Patsiokas | ................ | H02J 9/005 340/309.4 |
| 5,481,259 A * | 1/1996 | Bane | ...................... | G08C 17/02 340/505 |
| 7,274,305 B1 * | 9/2007 | Luttrell | ..................... | B61L 1/20 324/141 |
| 7,298,288 B2 * | 11/2007 | Nagy | ..................... | G01D 4/002 340/870.02 |
| 7,417,557 B2 * | 8/2008 | Osterloh | ................ | G01D 4/004 340/870.02 |
| 7,980,317 B1 * | 7/2011 | Preta | ...................... | A62C 37/00 169/60 |
| 7,994,935 B2 * | 8/2011 | Salser, Jr. | ................. | H04Q 9/00 340/870.02 |
| 8,610,594 B1 * | 12/2013 | Salser, Jr. | ............... | G01D 4/002 340/870.02 |

* cited by examiner

*Primary Examiner* — Stephen W Jackson
(74) *Attorney, Agent, or Firm* — Monty Simmons; Simmons Patents

(57) ABSTRACT

The disclosed inventions include an apparatus and method for providing a universal Automatic Meter Reading (AMR) system. Such system may be configured to work in a plurality of modes including a walk-by, drive-by and fixed network mode without hardware modifications. The apparatus tracks warranty data and provides for secure remote software configuration updates.

16 Claims, 19 Drawing Sheets

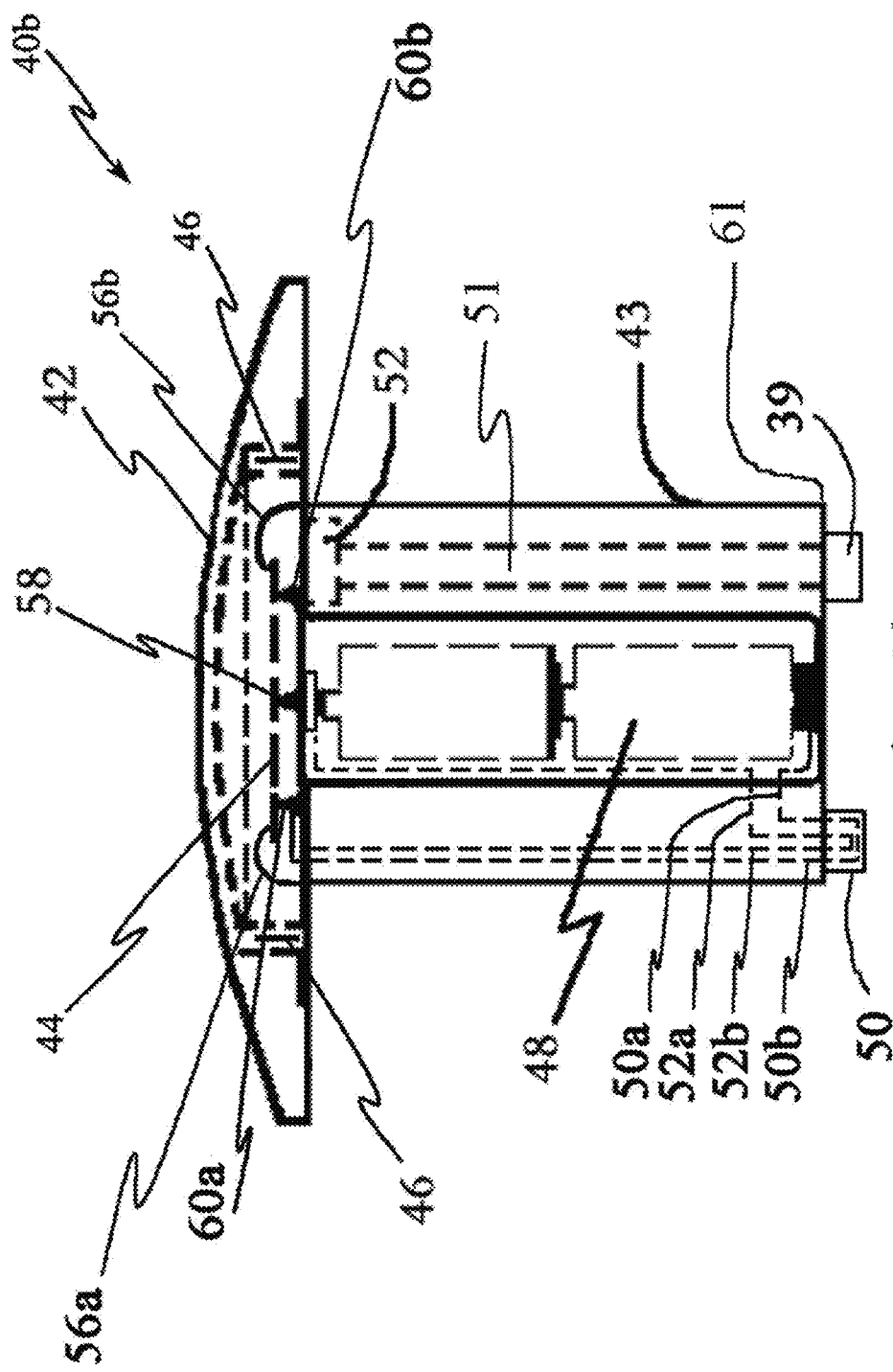

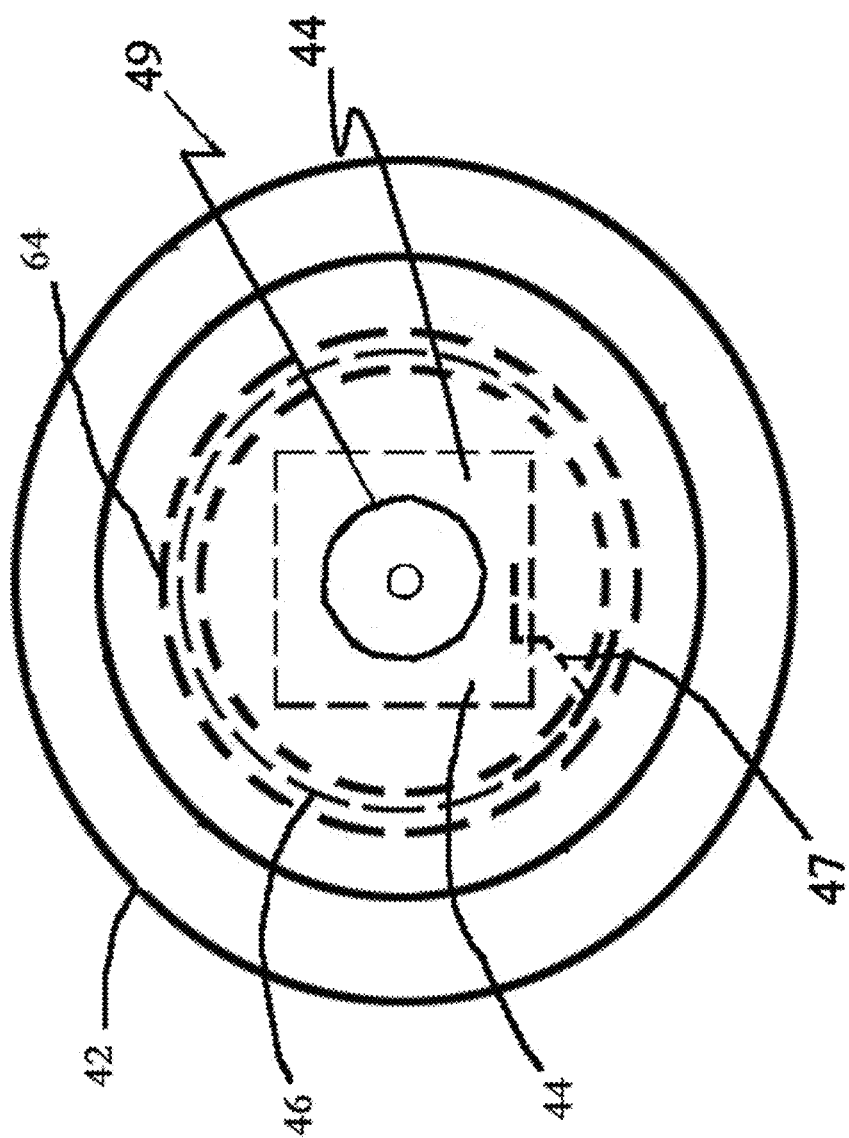

UNIVERSIAL AMR SYSTEM

CLAIM TO PRIORITY

This application claims priority to and is a continuation in part of application Ser. No. 13/555,065, filed Jul. 20, 2012 which claims priority to Ser. No. 13/159,360, filed Jun. 13, 2011, which is a continuation in part of application Ser. No. 12/143,822 (now U.S. Pat. No. 7,994,935) filed on Jun. 23, 2008, which is a continuation of Ser. No. 10/989,811, (now U.S. Pat. No. 7,498,953), filed on Nov. 16, 2004; application Ser. No. 13/159,360 is further a division of application Ser. No. 12/050,160 (now U.S. Pat. No. 7,980,317), filed on Mar. 17, 2007, which claims priority to provisional application 60/895,104, filed on Mar. 15, 2007; and is further a continuation in part to application Ser. No. 12/050,123, filed on Jun. 3, 2008, with is a divisional to Ser. No. 12/050,138, filed on Mar. 17, 2008, the entire contents of all such references are hereby incorporated herein by this reference for all that they disclose for all purposes.

TECHNICAL FIELD OF THE INVENTION

The present invention relates to an apparatus and method for a universal automatic utility meter reading (AMR) system.

BACKGROUND

Utility meters, including mechanical, electromechanical, and solid state meters, are well known and have been used for many years to measure the consumption of resources such as water, gas and electricity. Water meters, for example, generate data indicative of the consumption of water, where such data is used for billing purposes. Initially, utility meters were mechanical devices. As electronic technology advanced, such technology became smaller and less expensive, and thus, more suitable for use in the highly competitive and cost sensitive utility meter market. As such, the use of electromechanical (hybrid meters) and electronic meters has become more common. Indeed, most modern electricity meters, for example, are electronic meters (static meters).

Traditionally, meter reading personnel would periodically travel to each utility meter installation site and inspect a meter installation and manually record consumption data. The customer would then receive a bill based on such collected data. Today, increasing numbers of utilities are installing the most advanced reading technologies available. Such systems typically included a transmitter/transceiver associated with the utility meter for transmitting utility meter data to a remote location thereby offering improved data accuracy at the lowest meter reading cost available while eliminating the need for meter access (which is particularly useful for hazardous reading environments).

Notably, AMR systems used by water utilities include devices installed at the water meter configured for transmitting a data signal. Such devices are particularly sensitive to power consumption as most water meter installations are battery operated. As a result, such systems typically employ power saving schemes such as a drive-by/walk-by system.

For walk-by and drive-by AMR systems, a transmitter is associated with a utility meter and configured to wake up and transmit consumption data at a predefined time for a predefined duration in time (e.g. transmitter wakes up every day at 4:00 pm and transmits a 10 ms data burst every 10 seconds until 6:00 pm and then goes back into sleep mode). During the active period of the transmitter (between 4:00 pm and 6:00 pm for the above example) a utility representative either walks-by or drives-by the utility meter to receive the transmitted consumption data signal. Such a one-way system was disclosed in commonly owned U.S. patent application Ser. No. 10/989,811 filed on Nov. 16, 2004.

For yet another walk-by/drive-by AMR system, a transceiver replaces the transmitter. For this AMR system a simple receiver is configured for receiving a wake-up signal to be transmitted by utility personnel as he drives-by/walks-by a meter installation. When a wake-up signal is received, the AMR system's transmitter is activated and starts transmitting a data signal. Such a one-way system was disclosed in commonly owned U.S. patent application Ser. No. 10/989,811 filed on Nov. 16, 2004.

Conversely, a fixed network system eliminates the need to drive-by/walk-by a utility meter. For such a system, either the transmitter system (a) tracks the passage of time and transmits a data signal according to a predefined schedule or (b) the transmitter system includes a transceiver that listens for a wakeup signal. When a wake-up signal is received, the transmitter activates and transmits a consumption data signal to a remote location. Such a two-way system was disclosed in commonly owned U.S. Pat. No. 7,283,063 (application filed Jul. 7, 2005).

Prior to the development of the above described AMR transmitters there was a problem with prior art systems in that prior art drive-by/walk-by and Fixed network AMR systems were not compatible with each other. Restated, prior art drive-by/walk-by transmitters were not configured to operate in fixed network systems and vice-versa. For example, a typical drive-by/walk-by system transmitter may transmit a 0.08 Watt data signal while a typical fixed network transmitter may operate up to 1.0 watts (or perhaps more in some frequency bands). Additionally, it should be appreciated that for a two-way communication system, if a first transceiver (T1) transmits an X-watt signal to a second transceiver (T2), transceiver T2 should transmit an X-watt response signal (to minimize the risk of saturating the receiver). To use an analogy, if person A whispers to person B, person B should whisper back to person A, not shout back.

Such incapability between walk-by/drive-by/fixed network systems presents a problem to water utilities. The technology that provides the above described advantages is not free and utilities must be careful to select the best AMR system for their needs. Additionally, while a fixed network system may clearly the best technical solution for a particular utility, such utility may not have the funds to install a fixed network solution. Thus, such a utility may simply purchase a system it can afford such as a less expensive walk-by/drive-by system. When the above described utility decides to upgrade to a fixed network solution as funds become available, it must replace the drive-by transmitters with RF systems suitable for a fixed network. Such an upgrade process is clearly a waste of resources as perfectly good transmitters are scrapped.

What is needed is an AMR device configured to be associated with a water utility meter and that may be configurable to operate in one of a plurality of modes (such as a walk-by, drive-by and a Fixed Network mode) that includes auto-calibration routines to configure the network. With such an AMR device, a water utility may first implement a walk-by/drive-by AMR system and then upgrade to a fixed network solution at minimal costs. Additionally, there is a need for a self-calibrating system that can determine the optimum transmitter power level to avoid having one transmitter "shout" when it could "whisper" thereby lowering power consumption while improving communication integrity.

Yet another problem with transmitters associated with water meters is the power source. All known prior art transmitters associated with a water meter include a battery. While most prior art utility meters powered by a battery uses batteries with a life span of 5 or more years, the cost of ownership of a transmitter with a battery compared to a transmitter with no battery is significantly greater. In fact, perhaps the most common question a potential owner of a utility meter will ask is: "how long will the batteries last?" Various embodiments of the disclosed invention include transmitters that scavenge electromagnetic energy from the environment that is stored in electronic components such as capacitors and perhaps batteries. Restated, embodiments of the current invention include a battery free transmitter design.

SUMMARY

Objects and advantages of the invention will be set forth in the following description, or may be obvious from the description, or may be learned through practice of the invention.

Broadly speaking, a principal object of the present invention is to provide universal transmitter for transmitting data from a metering device to a remote location wherein said transmitter can transmit using power derived from scavenged electromagnetic energy.

Another general object of the present invention is to provide a method and apparatus for a universal transmitter that can work in a plurality of modes including a drive-by, walk-bay, and fixed network mode.

Still another general object of the present invention is to provide an AMR system comprising a data collector with functionally-self-healing features.

Yet another general object of the present invention is to provide for a data collector with self-healing features wherein said data collector transmits a wakeup signal that also provides power to the power storage components used in a remote battery free transmitter.

Additional objects and advantages of the present invention are set forth in, or will be apparent to those skilled in the art from, the detailed description herein. Also, it should be further appreciated that modifications and variations to the specifically illustrated, referenced, and discussed steps, or features hereof may be practiced in various uses and embodiments of this invention without departing from the spirit and scope thereof, by virtue of the present reference thereto. Such variations may include, but are not limited to, substitution of equivalent steps, referenced or discussed, and the functional, operational, or positional reversal of various features, steps, parts, or the like. Still further, it is to be understood that different embodiments, as well as different presently preferred embodiments, of this invention may include various combinations or configurations of presently disclosed features or elements, or their equivalents (including combinations of features or parts or configurations thereof not expressly shown in the figures or stated in the detailed description).

Additional embodiments of the present subject matter, not necessarily expressed in this summarized section, may include and incorporate various combinations of aspects of features or parts referenced in the summarized objectives above, and/or features or components as otherwise discussed in this application.

Those of ordinary skill in the art will better appreciate the features and aspects of such embodiments, and others, upon review of the remainder of the specification.

BRIEF DESCRIPTION OF THE DRAWINGS

A full and enabling description of the present subject matter, including the best mode thereof, directed to one of ordinary skill in the art, is set forth in the specification, which makes reference to the appended figures, in which:

FIG. 2b is a side elevated view, with a partial phantom view, of a communication apparatus housing comprising a top-section and a depending base comprising batteries;

FIG. 3 is a top view, including a partial phantom view, of a transmitter top-section (42);

Figure 1:
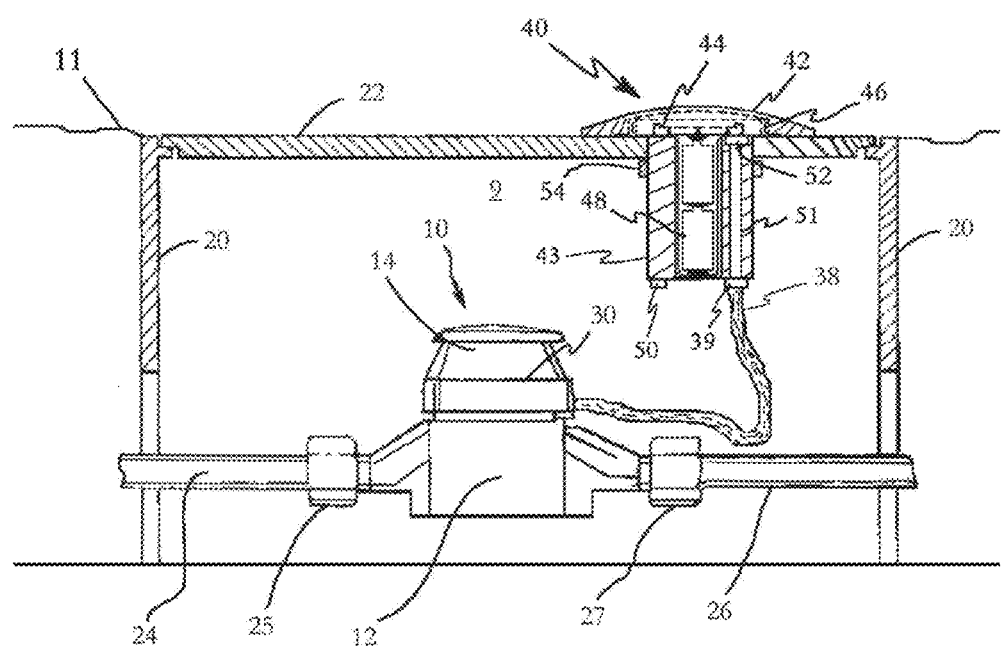
FIG. 1 is a graphical illustration of a side elevated view of an in ground pit (9) enclosure, including a partial cut away section, housing a fluid meter attached to a communication apparatus.

Repeat use of reference characters throughout the present specification and appended drawings is intended to represent the same or analogous features or elements of the present technology.

DETAILED DESCRIPTION

Reference now will be made in detail to the embodiments of the invention, one or more examples of which are set forth below. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention covers such modifications and variations as come within the scope of the appended claims and their equivalents. Other objects, features, and aspects of the present invention are disclosed in or may be determined from the following detailed description. Repeat use of reference characters is intended to represent same or analogous features, elements or steps. It is to be understood by one of ordinary skill in the art that the present discussion is a description of exemplary embodiments only, and is not intended as limiting the broader aspects of the present invention.

It should be appreciated that this document contains headings. Such headings are simply place markers used for ease of reference to assist a reader and do not form part of this document or affect its construction.

For the purposes of this document two or more items are "mechanically associated" by bringing them together or into relationship with each other in any number of ways including a direct or indirect physical connection that may be releasable (snaps, rivets, screws, bolts, etc.) and/or movable (rotating, pivoting, oscillating, etc.)

Similarly, for the purposes of this document, two items are "electrically associated" by bringing them together or into relationship with each other in any number of ways. For example, methods of electrically associating two electronic items/components include: (a) a direct, indirect or inductive communication connection, and (b) a direct/indirect or inductive power connection. Additionally, while the drawings illustrate various components of the system connected by a single line, it will be appreciated that such lines represent one or more connections or cables as required for the embodiment of interest.

While the particulars of the present invention may be adapted for use providing Automatic Meter Reading (AMR) capabilities and associated technology to utility meters metering the consumption of commodities such as gas, water, oil, electricity, etc., the examples discussed herein are primarily in the context of water consumption.

FIG. 1 shows a side view, including a partial cutaway section, of an exemplary utility meter (10) configured with Automatic Meter Reading (AMR) technology wherein the meter is housed in a below ground enclosure (9), hereafter referred to as pit (9). Pit (9) is shown comprising sides (20) and lid (22). Utility meter (10) is shown comprising a fluid chamber (12) and a register (14). The bottom of register (14) releasably attaches to the top of fluid chamber (12) forming an enclosed void (not shown) between register (14) and fluid chamber (12). Fluid chamber (12) comprises water inlet (25) and water outlet (27). Water line (24), connects to a water source at one end, runs into pit (9) and attaches to fluid chamber inlet (25) at the opposite end. Water line (26) attaches to fluid chamber outlet (27) at one end and continues through pit (9) to a water consumer. Fluid chamber (12) further houses a rotating element (not shown) that is placed in the path of fluid flow through the meter. The rotating element may be constructed of magnetic material or, alternatively, may be associated with magnetic material (e.g. a magnet). As the rotating element rotates in response to fluid flow through meter (10), a rotating magnetic field is generated. It will be appreciated that the rotating element in fluid chamber (12) may be replaced by other technologies that create other types of magnetic fields that vary over time (e.g. an oscillating element that generates an oscillating magnetic field) without departing from the scope of this invention.

Register (14) houses elements for detecting a rotating magnetic field and associating such rotations with water consumption thereby generating resource consumption data. Register (14) may also house components for displaying consumption data. Alternatively, Register (14) may simply output pulses to an electronic device associated with register (14) wherein such pulses are relatable to the amount of water flowing through meter (10). Such technology is well known and understood by those skilled in the art, and a detailed explanation thereof is not necessary for purposes of describing the method and system according to the present invention.

Figure 2A:
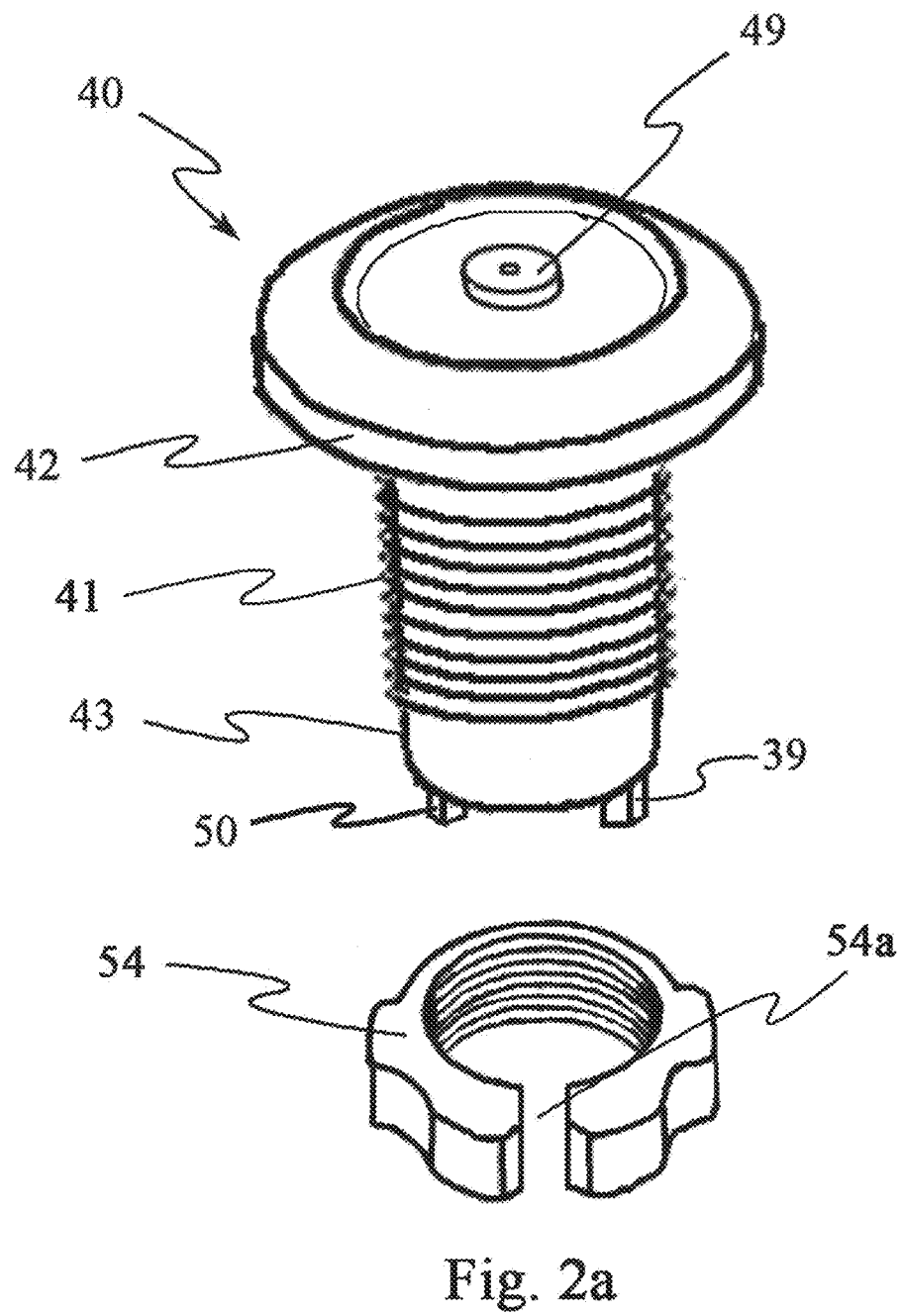
FIG. 2a is a side perspective view of one exemplary embodiment of a communication apparatus with securing nut (54)

Also shown in FIG. 1 is a communication apparatus (40) for transmitting data from meter (10) to a remote location. Communication apparatus (40) comprises an enclosure having a top-section (42) and a depending base (43). Top-section (42) rests generally on top of the pit lid (22) substantially adjacent to an opening through the pit lid. Depending base (43) extends from top-section (42) to a point at least partly through the pit lid opening. As can be seen in FIG. 1, depending base (43) extends completely through pit lid (22). For this embodiment of the invention, communication apparatus (40) is associated with meter (10) through a wired communication link (38). As shown in FIG. 2a, depending base (43) may further comprise threads (41) suitably sized for receiving securing nut (54). Securing nut (54) may include gap (54a) to provide a means for installing and removing securing nut (54) without disconnecting communication link (38).

Figure 1B:
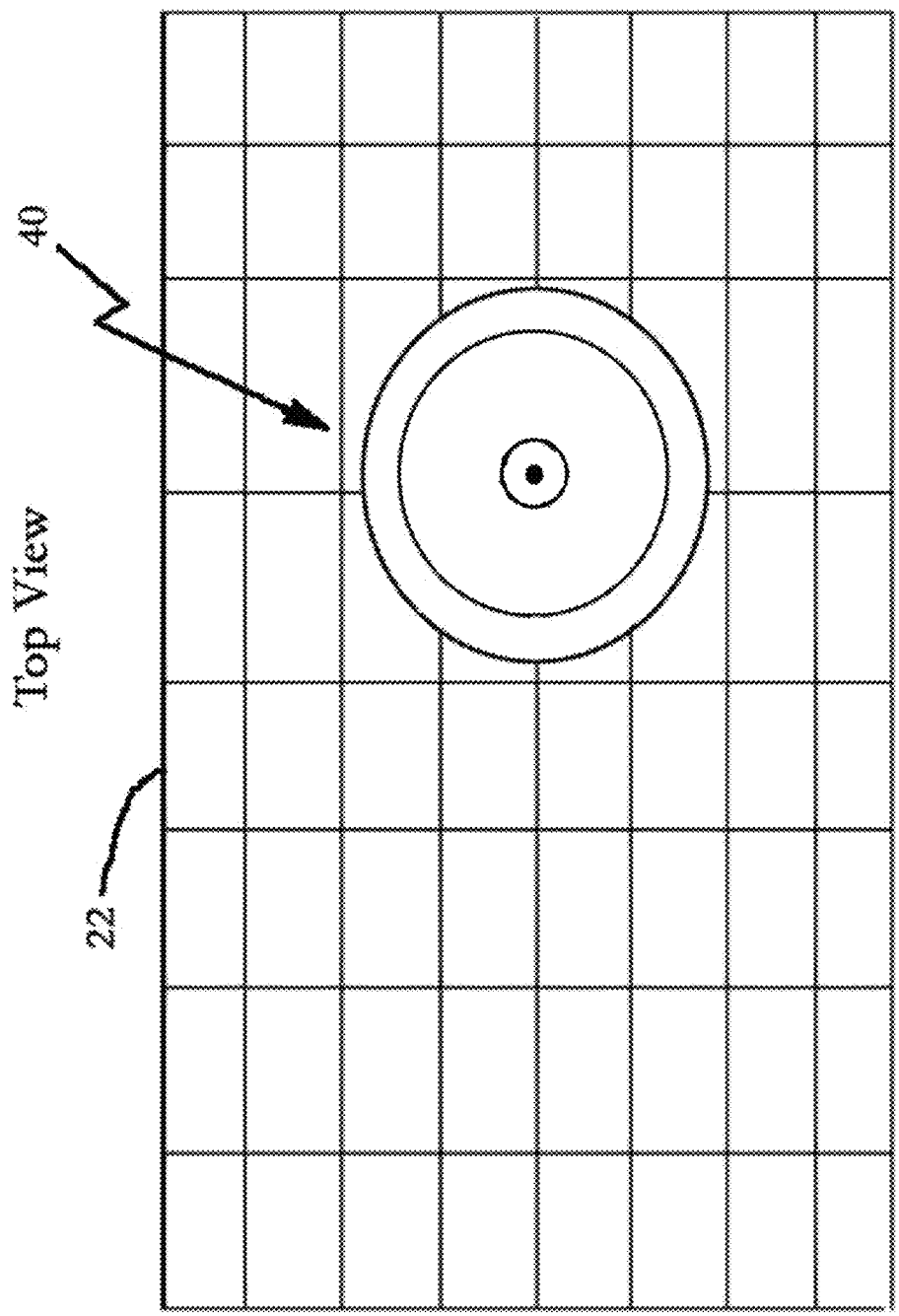
FIG. 1b is a top view a one exemplary embodiment of a communication apparatus resting generally on top of a pit lid (22)

FIG. 1b shows a top view of communication apparatus (40) resting generally on top of pit lid (22). Coil/core interface (49) is shown in the center of top-section (42) although interface (49) may be located anywhere on top-section (40) without departing from the scope of the present invention. It should be noted that for the meter installation shown in FIG. 1, pit lid (22) is generally at ground level. It will be appreciated, however, that communication apparatus (40) may be installed in above ground enclosures and pit lid (22) may be the "side" of such enclosure without departing from the scope and spirit of the present invention.

Referring now to FIG. 2b, a side view, including a partial phantom view, of one embodiment of communication apparatus (40) is shown. Communication apparatus (40) has a circuit board (44) disposed within top-section (42) and supported by stand-offs (58, 60a, 60b). Circuit board (44) may also be secured in top-section (42) by plastic grip tabs integral to the housing or any other suitable means. For this embodiment, stand-off (60a) and stand-off (60b) also provide a ground connection between circuit board (44) and power source (48) (described later). Stand-off (58) provides a power connection to circuit board (44). Resilient board clips (56a, 56b) secure circuit board (44) against the stand-offs thereby securing the circuit board within top-section (42). Such resilient clip/stand-off technology provides for a bolt/screw free design that simplifies assembly and lowers manufacturing costs.

Circuit board (44) comprises transmitter circuitry (one exemplary transmitter is described below) associated with antenna (46). It should be noted that the transmitter circuitry may be associated with any type of substrate other than a circuit board without departing from the scope and spirit of the disclosed inventions. Both circuit board (44) and antenna (46) are at least partially disposed within top-section (42). Additionally, antenna (46) may be disposed at least partially outside of top-section (42) to facilitate an improved electromagnetic radiation pattern. Alternatively, antenna (46) by be integral to circuit board (44), such as a trace or a slot antenna formed on/within circuit board (44). As shown in FIG. 3, for this embodiment of the invention, antenna (46) is positioned in antenna guide (64) and at least partially circles circuit board (44). Any type of suitable antenna technology may be used and such antenna technology is well known and understood by those skilled in the art, and a detailed explanation thereof is not necessary for purposes of describing the method and system according to the present invention.

Antenna (46) is coupled to the transmitter circuitry via connector (47). Notably, any suitable apparatus or method may be used for associating antenna (46) directly or indirectly (inductive/capacitive) to the transmitter circuitry so that data-signals generated by the transmitter are propagated by antenna (46) to a remote location. Exemplary remote locations include a hand held computer, perhaps just a few feet away from the meter installation and hundreds of feet away from the meter. A remote location may be in a vehicle equipped with a receiver wherein the vehicle is driven by the meter installation. Depending on the transmitter power level, a remote location may be miles away from the meter installation site.

As shown in FIG. 2b, a power source (48) is associated with circuit board (44) via wired connections (50a, 50b, 52a, 52b) and is configured for supplying power to the circuitry on circuit board (44). For this embodiment of the present invention, power source (48) comprises two batteries connected in series and disposed within depending base (43). It will be appreciated that power source (48) may only comprise one battery or three or more batteries without departing from the scope and spirit of the invention. Additionally, as will be described in detail later, embodiments containing no batteries may be used where the batteries are replaced by EM Scavenger technology.

As noted earlier, the transmitter circuitry is associated with meter (10) through a wired transmitter-meter communication link (38) (FIG. 1). For this embodiment of the invention, wired conductors provide a connection between register (14) and depending base connector (39). A communication link runs through conduit (51) to communication connection (52) associated with transmitter board (44). Transmitter-meter communication link (38) is configured for transferring system-data between the transmitter and the meter. System-data is any data generated by meter (10), communication apparatus (40), or stored by a memory associated with the meter (10) or the communication apparatus (40). Exemplary system-data includes a meter identification number, consumption data, tamper data, battery status data, time data, system diagnostic data, or any other type of data. Transmitter-meter communication link (38) will be described in more detail below.

For meter installations located in hostile environments, such as water meter installations, the components within communication apparatus (40) should be adequately protected. For this embodiment of the invention, a potting compound or a sealing material may be use to protect various components of communication apparatus (40). Any suitable potting compound may be used including polymer based materials such as polyurethane or a fiberglass base material. Additionally, suitable sealants include a vulcanizing adhesive/sealant. The potting/sealing material may be injected into the housing thereby encasing substantially all of the top-section (42) components and depending base (43) components within the housing. It will be appreciated that when a potting material/sealant is used to encase the components within top-section (42) and depending base (43) as described above, such components can no longer be easily accessed for replacement or repair.

Alternatively, the housing may be constructed such that only the distal end (61) of depending base (43) has an opening allowing access to the inside of the housing. The distal end (61) may be sealed by a removable end cap (not shown) to prevent contaminates from reaching components within the housing. Such an arrangement could be configured to allow the components within top-section (42) and depending base (43) to be accessed for replacement or repair. It will be appreciated that any type of sealing material or method of sealing the internal components of top-section (42) and depending base (43) within the housing may be used without departing from the scope of the invention.

Referring back to FIG. 2b, power source (48) is now considered. For this embodiment of the present invention, power source (48) is preferably two AA lithium batteries although any type and number of batteries may be used without departing from the scope of the invention. Additionally, as will be described in detail later, some embodiments are battery free (i.e. no battery) where the system is powered by EM scavenging technology. Additionally, for still other embodiments, the system (a hybrid system) may comprise a backup battery and EM scavenging technology.

Power source (48) is associated with circuit board (44) through a multiple conductor wired connection (50a, 50b, 52a, 52b). Conductor (50a) attaches to the negative component of power source (48) at one end, and to auxiliary power connector (50) at the other end. Conductor (50a) is coupled to conductor (50b) within auxiliary power connector (50). Conductor (50b) provides an electrical connection between stand-off post (60a), stand-off post (60b), and conductor (50a). Similarly, conductor (52a) attaches to the positive component of power source (48) at one end, and to auxiliary power connector (50) at the other end. Conductor (52a) is coupled to conductor (52b) within auxiliary power connector (50). Conductor (52b) provides an electrical connection between stand-off post (58) and conductor (52a). One of ordinary skill in the art will appreciated that auxiliary power connector (50) provides a method of connecting additional power sources to communication apparatus (40) as well as providing a means for disconnecting power source (48) from circuit board (44). Such a configuration is particularly useful when power source (48) is encased in a potting material and not easily accessible as described above.

Figure 4:
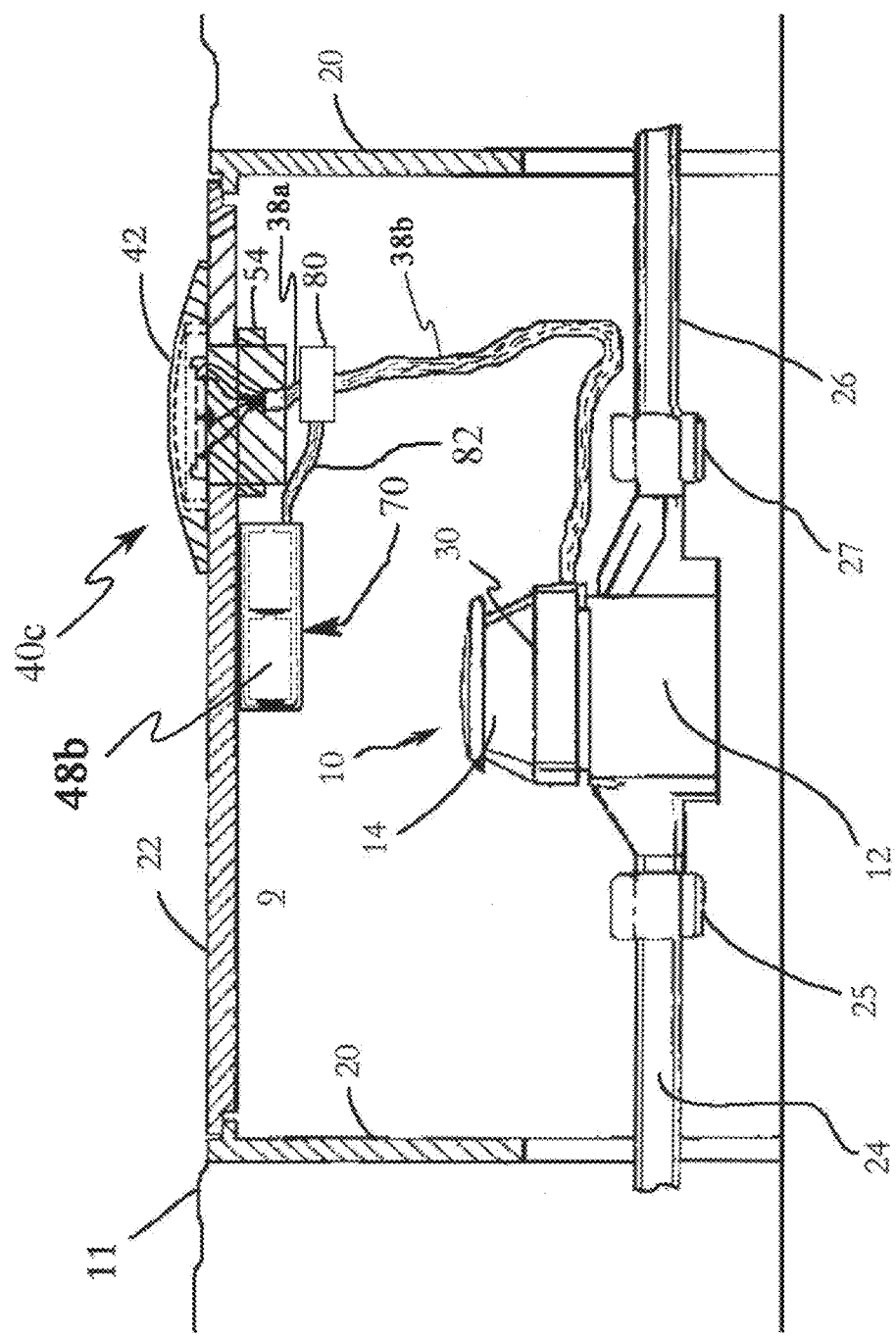
FIG. 4 is a side elevated view of an in ground pit (9) enclosure, including a partial cut away section, housing a fluid meter attached to a communication apparatus with a separate power pack.

Referring now to FIG. 4, a side view, including a partial cutaway section, of an alternative embodiment of the present invention is depicted. For this embodiment, depending base (43) does not house the power source. It should be noted that while depending base (43) is shown extending through pit lid (22) such a configuration is not required. Power pack (70) is shown attached to the underside of pit lid (22) and associated to circuit board (44) via a power-buss (82). Power-buss (82) preferably comprises a power conductor and a ground conductor and runs through the pit lid, via depending base (43). Power-buss (82) may comprise a first access point and a second access point wherein the first access point is associated with the power source (48b) and the second access point is associated with the circuit board (44). Other access points may be provided to allow power connections to other electronic devices associated with communication apparatus (40).

Figure 5:
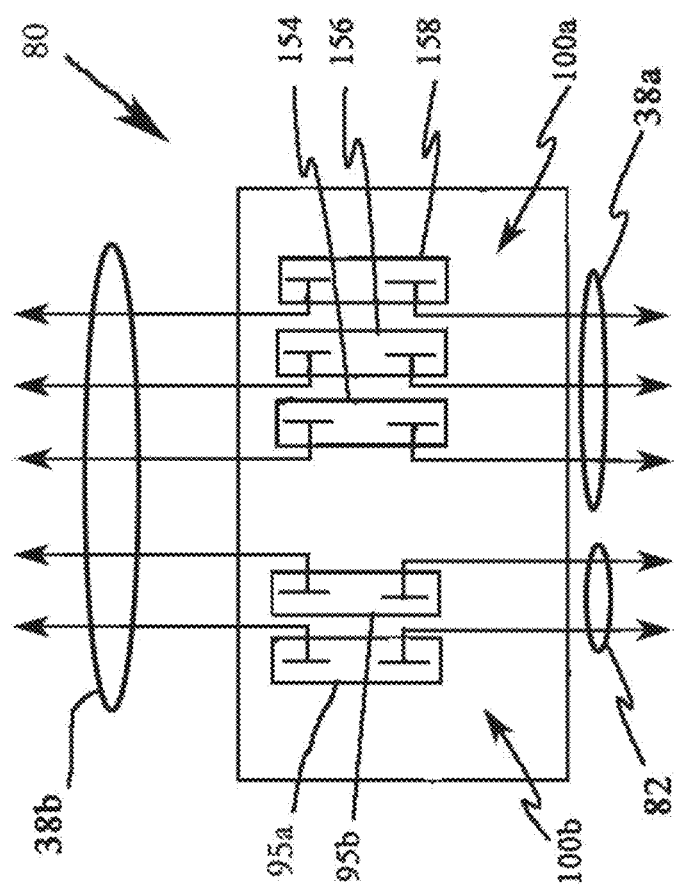
FIG. 5 is a schematic illustration of terminal block (80) for making and breaking connections in a communication link between a communication apparatus and a meter.

Additionally, the power conductor of power-buss (82) may be routed through terminal block (80). Terminal block (80) includes at least one node (i.e. junction) configured for (i) making a connection to the power conductor, (ii) breaking a connection to the power conductor, and (iii) for making and breaking the power conductor connection between the circuit board (44) and the power source (48b). As shown in FIG. 5, the power conductor and a ground conductor of power-buss (82) are both routed through terminal block (80). The power conductor connects to node (95a) while the ground conductor connects to node (95b). Such conductors exit terminal block (80) and are combined with the conductors in communications link (38b) where they eventually are placed in electrical contact with circuit board (44). Such nodes (95a, 95b) may be used to make and break the electrical contact between the power source (48b) and circuit board (44). Additionally, such nodes may be used to attach additional power sources to power-buss (82). While FIG. 5 shows both the power conductor and the ground conductor being routed through terminal block (80), it should be noted that only one such conductor or no power-buss (82) conductors may be routed through terminal block (80). The term "node", as used in this document, simply refers to either a junction for making and breaking an electrical connection, or a terminal point at which two or more branches of a circuit meet (i.e. a point that is common to two circuits or components).

Figure 6:
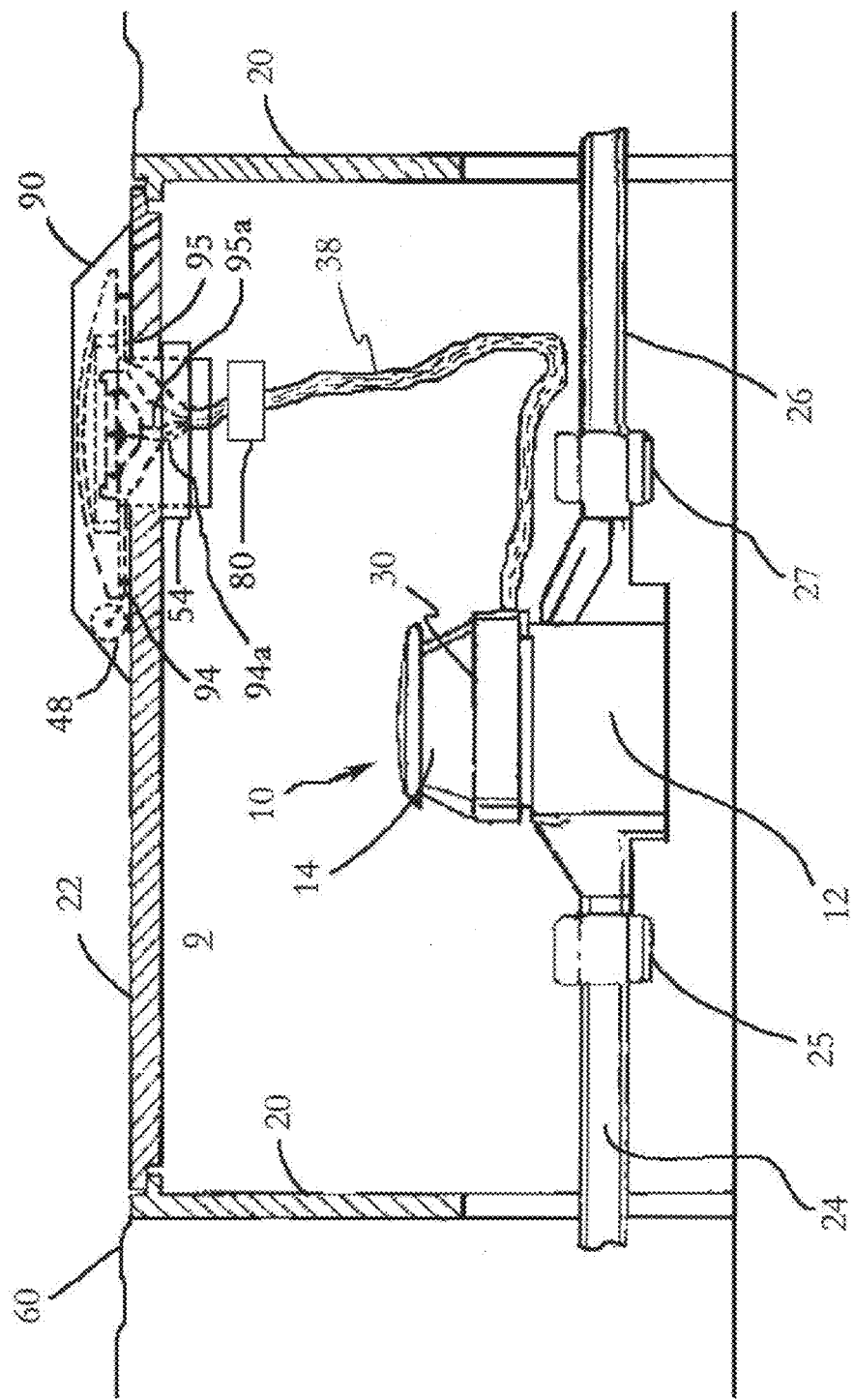
FIG. 6 is a side elevated view of an in ground pit (9) enclosure, including a partial cut away section, housing a fluid meter attached to a communication apparatus comprising an energy converter for recharging or supplying a trickle charge to a power source.

Referring now to FIG. 6, another alternative embodiment of the present invention is disclosed. For this embodiment of the present invention, power source (48), the transmitter and antenna (64) are all located above pit lid (22). Power source (48) comprises a rechargeable battery pack connected to an energy-converter (90). An energy-converter is simply a device that converts energy from one form to another. One example of an energy-converter is photovoltaic-radome (90) which generates electricity by absorbing electromagnetic radiation. Another example of an energy-converter is a betavoltaic device (described later).

Figure 7:
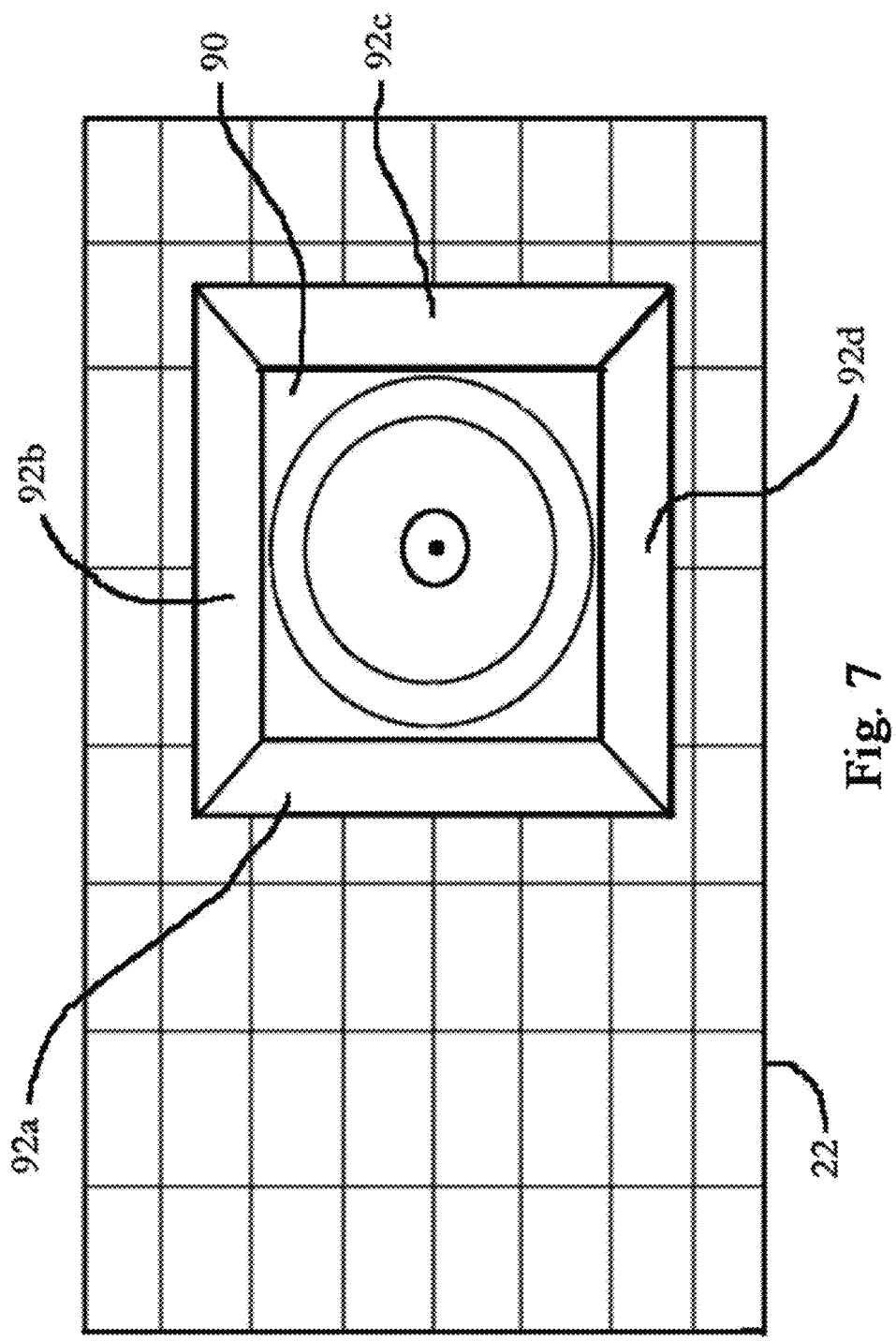
FIG. 7 is a top view of pit lid (22) and a communication apparatus comprising an energy converter.
Figure 8:
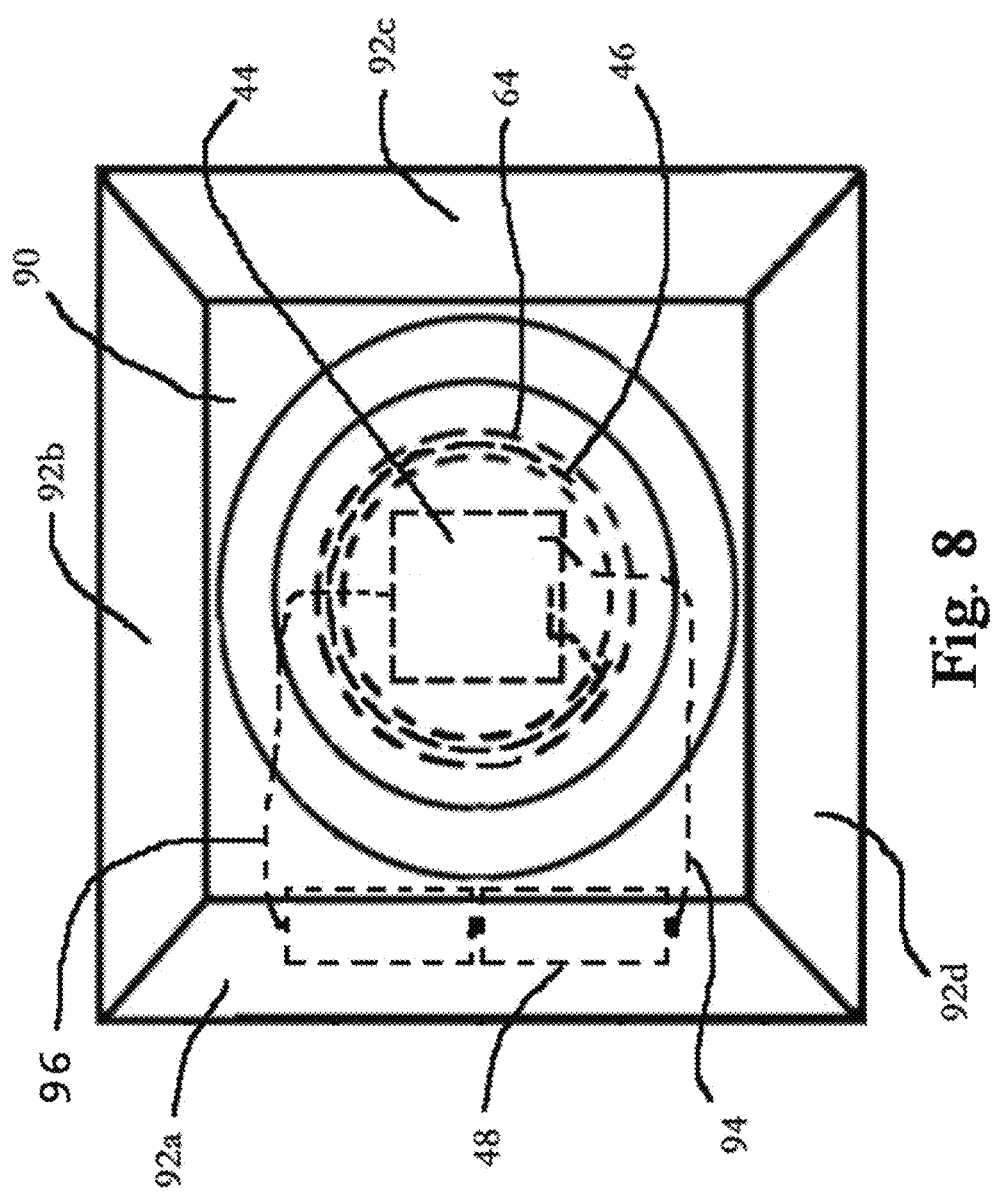
FIG. 8 is a top view of pit lid (22) and a communication apparatus comprising an energy converter including a phantom view of an above pit lid power source connected to circuit board (44)

FIG. 7 shows a top view of communication apparatus (40) comprising energy converter (90). FIG. 8 also shows a top view of communication apparatus (40) with an additional phantom image of power source (48) connected to circuit board (44) via power conductor (94) and ground conductor (96). For this embodiment of the invention, energy converter (90) has four sections of photovoltaic cells (92a, 92b, 92c, 92d) surrounding top-section (42). It will be appreciated that the number and shape of sections (92a-92d) and the number and shape of photovoltaic cells comprising each section may vary depending on any number of parameters including: cost, anticipated installation conditions, antenna design requirements, and power requirements. For the preferred embodiment, each photovoltaic cell section includes three photovoltaic cells, each supplying about 0.5 volts at 30-50 milliamps in full sunlight. Such photovoltaic cells are preferably connected in series to provide power to communications apparatus (40) and/or supply a charging current to power source (48). Additionally, to lower costs, the number of photovoltaic cells may be reduced to supply a simple trickle charge to power source (48) thereby extending the expected life of power source (48).

Similarly, power to communications apparatus (40) may be supplied by a betavoltaic device. The betavoltaic device uses a plurality of PN junctions in silicon to capture and convert electrons emitted from a radioactive gas, such as tritium, into a current. The PN junctions are arranged so as to form a "Dyson shell" surrounding the radioactive gas. To further increase efficiency, the surface area of the silicon surface is increased by adding indentions in such surface. Such indentions are preferably about 1 μm wide and about 40 μm deep. The size of the Dyson shell is selected depending on the application. A relatively smaller shell is selected when the betavoltaic device supplies a trickle charge to power source (48) compared to a relatively larger size shell when the betavoltaic device is used as power source (48) (i.e. a nuclear battery). The Dyson shell may take any suitable form including a sphere, a rectangular box, or a cylindrical tube similar in shape to a typical battery. The techniques for interconnecting PN junctions to form a shell as well as the techniques for adding indentions to the surface of PN junctions are well known in the art and a detailed explanation thereof is not necessary for purposes of describing the method and system according to the present invention.

In yet another embodiment of the invention, the above described hosing comprising top-section (42) and depending base (43) may be formed integral to a pit lid forming a one-piece module. Alternatively, the pit lid may be configured to house the various components described above. For this embodiment of the invention, the module comprises a module pit lid suitably sized to replace pit lid (22). A RF transmitter is disposed within the module pit lid. As described above, the RF transmitter is associated with an electronic device through either a wired or wireless communication link configured for transferring system-data between the RF transmitter and the electronic device. The electronic device may be register (14) or some other device in communication with register (14). An antenna is also associated with the RF transmitter and configured for propagating data-signals generated by the RF transmitter to a remote location outside the pit. As before, such data-signals may comprise at least part of said system-data.

Figure 9:
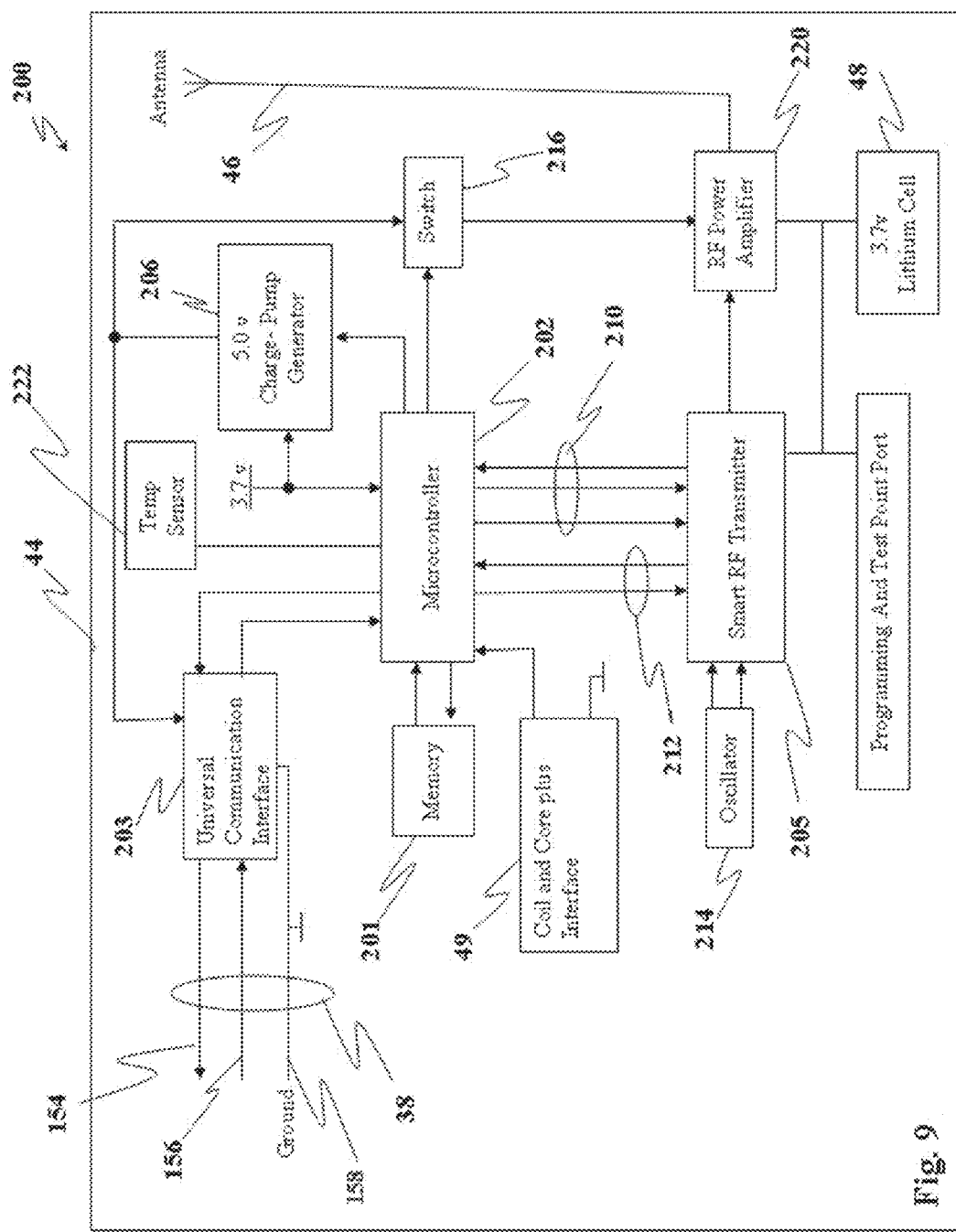
FIG. 9 is a block diagram illustration of one embodiment of a transmitter and associated circuitry.
Figure 10:
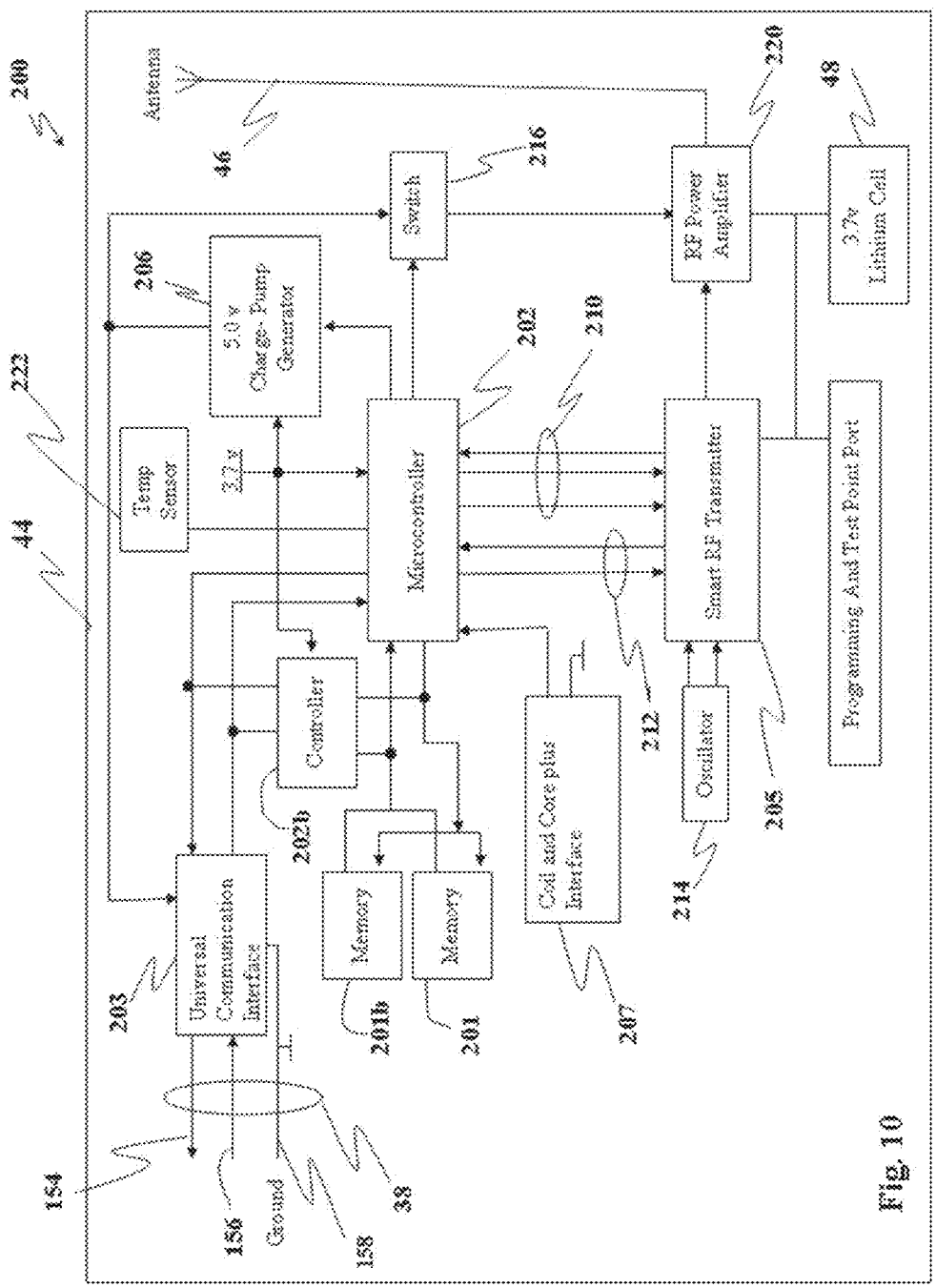
FIG. 10 is a block diagram illustration of one embodiment of a transmitter and associated circuitry including data-logger circuitry.

One embodiment of the transmitter circuitry located on circuit board (44) is now considered. Referring to FIG. 9, transmitter (200) is depicted in a block diagram representation. Transmitter (200) communicates with external devices either by transmitting a data-signal over antenna (46), through universal communication interface (203), or coil/core interface (49). In the preferred embodiment, transmitter (200) is connected to an electronic device associated with meter (10) via universal communication interface (203) and communication link (38). Such electronic device may be register (14) or an electronic device associated with register (14) and any type of communication interface may be used in place of universal communication interface (203) without departing from the scope of the present invention. Further, for some transmitter configurations comprising a receiver, such communication interfaces are configured for over air programming/reprogramming of the transmitter via a wireless communication link.

For the preferred embodiment, communication link (38) is a three conductor cable comprising a data line (154), power line (156), and a ground (158) over which serial communications is conducted. Such lines may be routed through terminal block (80) to provide a means for connecting additional electronic devices to communication apparatus (40). For example, a laptop computer may be connected through terminal block (80) to facilitate reprogramming of communication apparatus (40).

It will be appreciated that other wiring configurations and communication protocols may be used over wired or wireless communication connections and interfaces without departing from the scope of the present invention. When transmitter/reader communication interface (203) is connected to register (14) or an electronic device associated with register (14), such interface facilitates the transfer of data from electronic device/register to remote meter reading equipment via data signals propagated by antenna (46). When transmitter/reader communication interface (203) is connected to a computing device, such interface facilitates programming or reprogramming of the transmitter.

Transmitter (200) may also be programmed or reprogrammed by connecting a programming device, such as a laptop computer, inductively through coil/core interface (49). Coil/core interface (49) may also be used to perform firmware upgrades. Coil/core interface (49) may also be associated with touchpad technology to facilitate manual reading using an inductive probe.

As noted above, for one preferred embodiment, power is supplied to the transmitter electronics by power source (48) which defines at least one battery. Preferably, power source (48) is a single 3.7 Volt lithium cell battery. As noted above, in other configurations, power source (48) may be two AA lithium batteries. For system components that require greater than 3.7 volts to operate, charge pump generator (206) is used to generate a voltage larger than the supply voltage from which it operates. For this embodiment of the present invention, charge pump generator (206) generates 5 volts and powers universal communication interface (203) and RF switch (216).

Transmitter (200) further comprises processor/microcontroller (202). One of the functions of processor (202) is to control data transfers between meter register (14), memory (201), and remote meter reading equipment. It will be appreciated that memory (201) is optional and all data may be stored in memory located on processor (202). Processor (202) is further connected to coil/core interface (49). Coil/core interface (49) is used to program processor (202) as well as facilitate bios/firmware upgrades. Coil/core interface (49) may also be used by processor (202) to provide touch pad functionality to the system. Such touch pad technology is well known in the art. One example is disclosed in U.S. Pat. No. 5,619,192 issued to Ayala filed Jun. 14, 1994 and such document is incorporated by this reference for all that it discloses.

Still referring to FIG. 9, processor (202) is shown connecting to temperature sensor (222). Temperature sensor (222) may be a discrete component, as shown in FIG. 9, or it may be incorporated within processor (202). Microcontroller (202) uses temperature sensor (222) to monitor the ambient temperature within the transmitter enclosure. Alternatively, a temperature sensor may be used to monitor the temperature of a particular component. Processor (202) may also generate and store temperature-data that is later used to make adjustments to various operating parameters for transmitter (200) as described later. Such temperature-data may also be transmitted to a remote computer.

Processor (202) further connects to RF transmitter (205). RF transmitter (205) may be a single-chip transmitter or a transmitter circuit comprised of discrete components. RF transmitter (205) transmits over a frequency range of 804 MHz to 940 MHz, although other frequency bands may be used without departing from the scope of the present invention. For example, RF transmitter (205) may be used in the well-known 402/426/429/433/868/916 MHz ISM/SRD band systems. For the preferred embodiment of the present invention, transmitter (205) is a single-chip design that comprises (i) a communication bus for configuring and controlling the operation of the transmitter, (ii) a programmable output power level, (iii) a programmable output frequency, and (iv) may be powered by a 3.7 volt power source or an RF scavenger based power source. Such transmitters are well known in the art and are manufactured by MAXIM, ATMEL, INFINEON, Texas Instruments, and Chipcon.

Returning to FIG. 9, antenna (46) is shown connecting to RF power amplifier (220). The types of antennas that may be used include monopole, helical, and loop antennas. Antenna (46) is constructed so that its impedance matches the output impedance of RF power amplifier (220). For the preferred embodiment of the present invention, the output impedance of RF power amplifier (220) is 50 Ω.

Processor (202) configures/reconfigures RF transmitter (205) through transmitter communication interface (210). For the preferred embodiment of the present invention, transmitter communication interface (210) is a serial interface. Through transmitter communication interface (210), processor (202) can make configuration adjustments that affect the transmitter output power level, the frequency of the transmitted signal, and the transmitting mode. Processor (202) transfers the data to be transmitted over transmitter data buss (212).

In FIG. 9, oscillator (214) is shown connecting to RF transmitter (205). Oscillator (214) (one exemplary embodiment of a reference-frequency-generator) generates the reference frequency used by RF transmitter (205) to establish the carrier frequency of the transmitted signal. For the preferred embodiment, oscillator (214) is a crystal oscillator that oscillates at a frequency of 14.7456 MHz although other references may be used. RF transmitter (205) generates the carrier frequency of the transmitted signal by multiplying the output of oscillator (214) by a frequency-multiplier-value derived by an equation programmed into transmitter (205). Such frequency-multiplier-value is derived at least in part using a frequency-adjustment-value supplied by processor (202).

Frequency Stability

It is well known that a stable transmitted signal frequency is desired in almost all wireless communication systems. The more stable the transmitted signal frequency, the lower the cost of the electronics making up the receiver required to receive the transmitted signal. As noted above, for the present invention, a crystal oscillator is used to establish the reference frequency used by RF transmitter (205) to generate the carrier frequency of the transmitted signal. It will be appreciated that should the output of oscillator (214) drift, the carrier frequency of the transmitted signal will drift by such drift amount times the frequency-multiplier-value. For example, for a transmitted data-signal carrier frequency of 900 MHz and reference frequency of 14.7456 MHz, the frequency-multiplier-value would be 61.03516. If the reference frequency drifts by only 0.147456 MHz (1%) the carrier frequency will drift by about 9 MHz to 909 MHz.

Unfortunately, the outputs of all crystals drift as the temperature of the crystal changes. The more stable the crystal output frequency in response to changes in temperature, the more expensive the crystal. Fortunately, the drift of some low cost crystals substantially follows a known drift curve or known drift rate.

For one embodiment of the present invention, low cost crystals are used for oscillator (214) where the output of such crystal drifts in response to changes in temperature according to either a known frequency curve or known frequency rate (frequency-drift-data). If the frequency drifts according to a known drift rate, this value is stored in memory (201). If the frequency drifts according to a known drift curve, frequency drift/temperature change data representing such drift curve are stored in table form in memory (201). Both forms of oscillator output drift data are stored in memory (201) and are called frequency-drift-data.

For this embodiment of the present invention, processor (202) uses temperature sensor (222) to access real time (or near real time) temperature data relatable to the temperature of oscillator (214). For example, such temperature-data may be the ambient temperature within transmitter (200) enclosure, the ambient temperature within the pit (9), the temperature of at least part of the frequency-components that generate the reference-frequency. Processor (202) may store such temperature-data in memory (201) as well as transmit such temperature to a remote location.

For one embodiment, if the temperature drops below or exceeds a predefined threshold, a temperature warning may be issued. For example, a freeze warning may be issued where the temperature data drops below 32 degrees Fahrenheit. For such embodiments, Processor (202) may also compare such temperature-data to predefined temperature values. Such predefined temperature values may comprise max-temp value, min-temp value, and temp-range values. Such values are preferably predefined by a user and stored in memory (201). It should be apparent that such values would typically be selected by a user to signify possible problems should temperature sensor (222) generate temperature-data that exceeds or drops below a particular temperature value. For example, should processor (202) determine that temperature-data exceeds a predefined max-temp value, processor (202) may set a temperature-warning-flag and/or transmit at least one of the temperature-data and the max-temp value to a remote location.

Processor (202) then accesses the frequency-drift-data, determines a frequency-adjustment-value that substantially compensates for the expected drift in the reference-frequency due to a change in temperature, and sends the frequency-adjustment-value to RF transmitter (205) over transmitter communication bus (210). It should be appreciated that the frequency-adjustment-value may be incorporated into a configuration command that controls the RF transmitter (205) output frequency. Alternatively, the frequency-adjustment-value may be used by RF transmitter (205) in its calculations for determining the carrier frequency of the transmitted signal. For the purposes of this invention, regardless of whether processor (202) or RF transmitter (205) makes the frequency adjustment, a frequency-adjustment-value will be sent from processor (202) to RF transmitter (205) in one form or another (i.e. as part of a configuration command, as a discrete value, etc.).

Transmitted Power Level Stability

Considered next is the effect the status of power source (48) can have on the transmitted signal. As used in this document, the term "power quality" simply refers to any number of metrics typically used to benchmark the quality of the power provided by a power source. Such metrics include voltage level, current supplied, voltage level stability under load, etc., and provide a reference for tracking the status of a power source.

It is well known that the signal strength of a transmitted data-signal can weaken if the quality of power supplied to the transmitter/amplifier degrades beyond a certain point. For example, a transmitter may transmit a (X) dB signal when supplied with a voltage of 4.0 volts but transmit only a (X−0.5) dB signal when supplied with a voltage of 3.7 volts.

Notably, the status of power source (48) that powers RF transmitter (205) and RF power amplifier (220) may degrade over time. As a result, the quality of power supplied by power source (48) will degrade over time. As shown in FIG. 9, the output of transmitter (205) is amplified by RF power amplifier (220). Should voltage supplied by power source (48) to RF power amplifier (220) drop (as the status of the power source degrades over time), the power level of the transmitted data-signal will also drop. Thus, the status of power source (48) is another parameter that processor (202) monitors.

Initially, power-level-adjustment-data is either calculated or experimentally measured. For example, the strength of a data-signal transmitted by transmitter (205) may be monitored as the voltage supplied to transmitter 205 and/or RF power amplifier (220) is varied. Any change in transmitted data-signal strength is documented for each supplied voltage level. Such power-level-adjustment-data may be stored in table form in a memory associated processor (202).

Processor (202) is configured to measures the voltage supplied by power source (48). Processor (202) then accesses the power-level-adjustment data stored in memory (201). Using the power-level-adjustment data and the measured voltage level supplied by power source (48), processor (202) reconfigures RF transmitter (205) to transmit at a power level that maintains a substantially constant transmitted data-signal power level. This configuration may be used to provide for a substantially constant transmitted data-signal power level as power source (48) degrades over time. Processor (202) may additionally generate power source status data and may transmit such data to a remote location using RF transmitter (205).

Multiple Mode AMR Device Configurations

Figure 11:
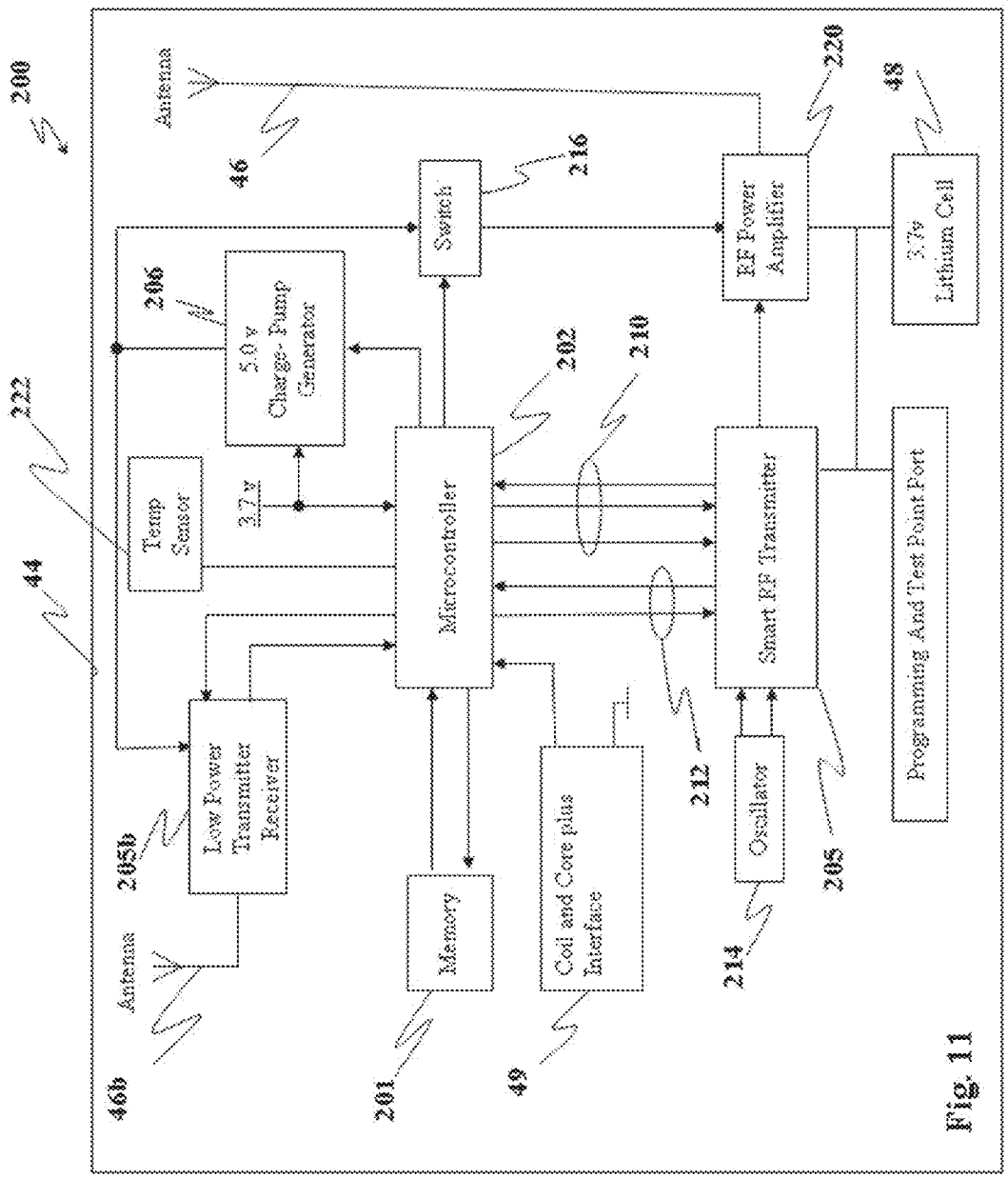
FIG. 11 is a block diagram illustration of one embodiment of a transmitter and associated circuitry including a wireless communication link comprising a receiver and a low powered transmitter.

Presented next are the modes of operation for transmitter (200) when configured as a Multiple Mode AMR device. For such configurations, FIG. 11 depicts one exemplary preferred embodiment. The components of transmitter (200) include processor (202) electrically associated with a RF transmitter (205) and with either a low power transceiver (205b) or simply a receiver (not a transceiver) with transmitter (200) being electrically associated with a utility meter (10) via a wired or wireless communication connection as described above depending on the desired implementation. In addition, such a multiple mode AMR device is configured to track the passage of time.

Transmitter (200) is configured to transmit a data signal over a range of output power levels depending on the transmitter mode selected. However, for the preferred embodiment, transmitter (200) will be configured with a maximum power level (e.g. 1 watt) that the transmitted signal is not to exceed regardless of the transmitter mode selected.

Transmit Mode I: Drive-By/Walk-By Using Time Tracking Function

As noted above, transmitter (200) is powered by an exhaustible power source. Consequently, minimizing power consumption is one goal of the present invention. Thus, to assist in minimizing power consumption, for the preferred embodiment, transmitter (200) does not transmit a data-signal continuously. Instead, transmitter (200) is placed in a sleep-mode during predefined periods. While transmitter (200) does include a receiver for receiving a transmitted data signal, for this mode of operation it is assumed that the utility personnel walking by or driving by the utility meter (10) does not have the capability to transmit a wakeup signal. Consequently, there will be no wakeup signal to turn on transmitter (200) and the receiver remains inactive to conserve power. To overcome the "no wakeup signal" problem, processor (202) is configured to track the passage of time.

Processor (202) may track the passage of time using any number of well-known methods and technologies for tracking time. For the preferred embodiment, processor (202) is operatively connected to a time keeping circuit that generates time-data. Such time keeping circuit may be a device external to processor (202) or internal to processor (202). Alternatively, processor (202) may track the passage of time by executing a time keeping program. For this embodiment of the present invention, processor (202) tracks the day of the week and the time of day (hour, minute, and second). Next, processor (202) accesses transmitter-schedule-data stored in a memory associated with processor (202) for determining when to transmit a data-signal. Examples of transmitter-schedule-data include a transmit start time, stop time, and transmit sequence.

Using such time-data and transmitter-schedule-data, the transmitter can be placed in a sleep-mode until processor (202) determines that a transmission session should begin. In addition, using such time-data, processor (202) can configure the transmitter to implement at least one of a plurality of possible transmitter sequences.

For the present embodiment of the invention, RF transmitter (205) is initially placed in a sleep-mode. While in sleep-mode, RF transmitter (205) consumes minimal power (or no power). Processor (202) tracks the passage of time by generating or accessing time-data. Next, processor (202) accesses the appropriate transmitter-schedule-data and compares the time-data to the transmitter-schedule-data. Examples of transmitter-schedule-data include a time period (such as 4:30 pm to 5:30 pm). When processor (202) determines that a transmission session should begin, processor (202) places transmitter (205) in a transmit-enable mode. The duration (length in time) of the transmit-enable mode may be a preset constant value or a user programmable value. While in transmit-enable mode, RF transmitter (205) may transmit a data-signal continuously or, to further conserve power, may transmit a data-signal according to a predefined transmit sequence. Restated, transmitter may be configured to transmit a data-signal for a predefined transmit-on time and then stop transmitting for a predefined transmit-off time. Such a sequence would repeat for the duration of the transmit-enable period.

Additionally, transmitter sequences may be tailored for a particular situation. For example, a walk-by transmit mode could be a transmitter sequence specifically selected for relatively slow moving persons walking through a neighborhood with remote meter reading equipment. For such situations, longer transmit-off times are desirable. Similarly, a drive-by transmit mode could be a transmitter sequence specifically selected for situations where the remote meter reading equipment will be attached to a moving vehicle. Such a transmitter sequence could be based on the speed limit in the surrounding area or a generic on-off sequence.

By way of example, consider the following transmission schedule. Processor (202) is programmed to enable the transmitter for two hours on Mondays, Wednesdays, and Fridays, beginning at 4:00 pm. Processor (202) determines that it is 4:00 pm on a Monday and processor (202) places RF transmitter (205) in transmit-enable mode. Next, processor (202) accesses transmission sequence data stored in memory (201) and determines the transmission sequence to be used. For this example, the transmission sequence is as follows, transmit data-signal for six seconds and stop transmitting data-signal for 6 seconds. Processor (202) sends the corresponding configuration commands to RF transmitter (205) over transmitter communication bus (210). RF transmitter (205) begins transmitting the data-signal for six seconds followed by a six second period without transmitting the data-signal. Processor (202) continues to track the passage of time until processor (202) determines that the current time is 6:00 pm. Next, processor (202) places the RF transmitter (205) back into sleep-mode.

In addition to saving power by limiting transmitter on times, the walk-by/drive-by configuration may be configured to transmit power at a reduced power level. In a walk-by/drive-by system, the utility meter personnel will, by definition, walk-by or drive-by relatively close to the transmitter (200). As a result, the power level of the transmitter signal can be set accordingly.

As previously noted, processor (202) may be programmed to reconfigure RF transmitter (205) to transmit over a range of power levels. For the preferred embodiment of the invention, a default Walk-by/Drive-by Power Level (WDPL) is stored in a memory associated with processor (202). For example, a default WDPL value may be 80 mW. When processor (202) determines a data signal is to be transmitted, processor (202) retrieves the WDPL value and configures RF transmitter (205) to transmit a data signal at the WDPL power level.

The WDPL value is preferably user programmable for individual units as some convenient walk-by/drive-by distances may be unusually long requiring transmitter (200) to transmit at higher power levels. Such versatility allows a default WDPL that is suitable for most installations while allowing higher WDPL values for installations where longer transmission distances are required.

Exemplary transmitter sequences may include power level, a time period, and a transmitter sequence. For example, one set of transmitter sequence values includes a WDPL value of 1 mW, time period of 4:30 pm to 5:30 pm, a transmit period of 4 s, a transmit time of 3 ms. For such transmitter sequence values, the transmitter is placed in transmit-enable mode at 4:30 pm and placed back into a sleep mode at 5:30 pm. When in transmit-enable mode, the processor sets the transmitter power level to 1 mW and transmits a 3 ms data-signal every 4 seconds.

A second set of transmitter sequence values includes a WDPL value of 500 mW, time period of 4:30 pm to 5:30 pm, a transmit period of 30 s, a transmit time of 3 ms. For this example, the transmitter is placed in transmit-enable mode at 4:30 pm and placed back into a sleep mode at 5:30 pm. When in transmit-enable mode, the processor sets the transmitter power level to 500 mW and transmits a 3 ms data-signal every 30 seconds.

As the examples illustrate, when power levels are increased, the time between transmissions can be decreased as the transmitted data-signal has a longer range which means a walking person will likely be in range of such a signal for a longer period of time.

Transmit Mode II: Drive-By/Walk-By Using Receiver Function

Presented next is an alternative walk-by/Drive-by configuration that uses a receiver to listen for a wakeup signal. For such a configuration, processor (202) is configured to use receiver (205b) to listen for a wakeup signal. The utility representative uses interrogation equipment that transmits a simple wakeup signal. When such utility representative comes within range of a utility meter (as he walks or drives by the utility meter), processor (202) detects the wakeup signal and starts transmitting a data signal according to a walk-by or drive-by transmit sequence as described above. The transmitter wakeup signal may be a generic signal that wakes up a plurality of meters and/or a meter specific signal that only wakes up the ARM enabled meter of interest (i.e. only one meter).

It should be appreciated that having a receiver powered continuously also consumes power. Consequently, transmit mode II may also use the time tracking function and only active the receiver according to a predefined schedule.

Transmit Mode III: Fixed Network Using Time Tracking Function

Presented now is Transmit Mode III which is a fixed network mode of operation for transmitter (200). In the fixed network mode, transmitter (200) transmits a data signal that is received by a repeater or collector which in turns transmits the data over a wired or wireless communication link to a remote location. As before, to minimize power consumption, transmitter (200) does not transmit a data-signal continuously. Instead, transmitter (200) is placed in a sleep-mode and transmits a data signal according to a predefined transmission schedule or upon remote command.

For such a configuration, processor (202) tracks the passage of time. When the processor determines that it is time to transmit a data signal, processor (202) retrieves the necessary information to configure RF transmitter (205), configures RF transmitter (205) according to Transmit Mode III criteria and transmits a data signal. As previously noted, processor (202) may be programmed to reconfigure RF transmitter (205) to transmit over a range of power levels. For the preferred embodiment of the invention, a default (e.g. 250 mW)

Fixed Network Power Level (FNPL) is stored in a memory associated with processor (202). However, such a FNPL value may be changed as required for a particular installation. Such versatility allows for a default FNPL that is suitable for most installations while allowing higher FNPL values for installations where longer transmission distances are required. Similarly, the FNPL level may be set to a value below the default value for some installations.

Additionally, the above described Fixed Network Mode may also use receiver (205b) to receive a data signal from a remote location. For this embodiment, processor (202) is configured to use transceiver/receiver (205b) to listen for a data signal. To conserve power, the receiver is preferably activated according to a receiver schedule. When processor (202) determines that it is time to active transceiver/receiver (205b), the receiver is turned on and processor (202) listens for a properly formatted R-data-signal.

Receiver Function—At Utility Meter

The multiple mode AMR device receiver function may be implemented in several configurations. In the simple wake up configuration, receiver (205b) is a simple receiver that listens for a carrier signal at a predefined frequency. In yet another configuration, the receiver (205b) is capable of receiving a complex data signal containing instructions to be implemented by processor (200). To conserve power, receiver (205b) is not in continuous operation but operates according to a receiver schedule. The receiver schedules for each ARM device is known by the utility company and if the utility company needs to contact a particular AMR device installation, a data signal is transmitted at the appropriate time that is intercepted by transceiver/receiver (205b) and directed to processor (202). Preferably, the utility company's transmitted data signal comprises a unique transmitter identifier so that transmitter (200) may ignore signals that do not contain the appropriate transmitter identifier.

The utility company data signal may simply be a request for transmitter (200) to retransmit meter data. The utility company's data signal may also contain information for updating configuration criteria stored in a memory associated with transmitter (200). For example, the utility company's data signal may contain information to change the WDPL, the FNPL, the drive-by/walk-by transmitter schedule, the receiver schedule, the system clock value, as well as other values.

By way of example, assume a receiver sequence includes the following values: time period, receiver on time, receiver off time. For one embodiment, the time period is 5:00 am to 5:00 pm, and 12:15 am to 1:15 am, receiver on time is 2 seconds and the receiver off time is 8 seconds. For this example, a receiver X is placed in receiver-enable mode from 12:15 am to 1:15 am and 5:00 am to 5:00 pm. When in receiver-enable mode, the receiver X listens for a properly formatted R-data-signal for 2 seconds out of 10 seconds. When a remote transmitter wishes to communicate with receiver X, the transmitter transmits a properly formatted R-data-signal for 10 seconds. IF receiver X is in receiver-enable mode, receiver X will receive and process the R-data-signal and perform the requested tasks.

Transmitter Calibration

A transmitter communicating with a receiver is similar, in some ways, to two humans communicating with each other. For example, if I whisper to you, you should probably whisper back to me, not shout back as such may damage my ears and wastes energy. For transmitters and receivers, a seminar analogy would be "if you talk to me at 1 watt I will talk to you at 1 watt". Such a method contains at least two benefits: (1) minimal amount of energy is wasted by not transmitting at too high a power level; and (2) the receiver circuits will not be saturated/damaged by an overly powerful received signal. However, as will be appreciated by those of ordinary skill in the art the environments in which RF transmitters are installed are normally not static environments. Thus, a suitable transmitted power level of one day may not be strong enough on a different day.

For example, vehicles can be parked in the transmission path and buildings may be constructed in the transmission path between a transmitter and a receiver. Further, ambient weather conditions and interfering RF energy are not static. As a result, a 100 mW transmission power level may be enough on one day to transmit a signal from a utility meter to a receiver whereas on a different day a 200 mW transmission power level is required (due to some change in the environment). Such changes may be temporary (vehicle parked over transmitter) or substantially permanent. Thus, the system needs to be configured to dynamically determine the transmitter power level for the transmitter (200) associated with the utility meter (10).

For the current embodiment transmitter (200) is configured to communicate with a remote receiver such as a gateway. Such remote receiver is configured to transmit a data signal that includes the power level at which the remote receiver transmitted such data signal. Additionally, transmitter (200) is configured to receive such data signal and determined the power level of the received data signal. Transmitter (200) then subtracts the power level of the received data signal from the power level value contained within such data signal to determine the optimal power level to transmit a response data signal.

For example, suppose a remote receiver transmit 300 mW data signal to a utility meter requesting data. The transmitted data signal contains the value "300 mW" indicating to transmitter (200) the original strength of the transmitted data signal. Upon receiving such data signal, transmitter (200) determines that the received data strength is 250 mW. Thus, transmitter (200) now knows that the transmission path loss between transmitter (200) and the receiver is 50 mW (300 mW-250 mW). Transmitter (200) can now determine the optimum transmitter power level in which to transmit a data signal in response to the receiver's request for data.

Hour Meter and Battery Life

For embodiments of transmitter (200) using a power source such as a battery, the remaining battery life of such power source is monitored.

As is already been described above, certain embodiments of transmitter (200) are configured to monitor the voltage level of a power source supplying power to the transmitter circuitry so that the stability of power level for the transmitted signal can be maintained over time. Such voltage level drops may be recorded and transmitted to a remote device where such data can be used to determine the expected life remaining in the power source.

For yet another alternative embodiment of the invention, transmitter (200) performs an hour meter function. Batteries create electron flow in a circuit by exchanging electrons in ionic chemical reactions. Further, there are a limited number of molecules in any charged battery available to react. Thus, there are a limited amount of total electrons that any battery can provide to a circuit before its "energy" is depleted. Consequently, a battery with a capacity of 1 amp-hour should be able to continuously supply a current of 1 amp to a load for exactly 1 hour. Of course, such only happens in the "ideal world" and in the real world the discharge equation is more complex. Regardless, such equations for today's batteries with appropriate correction factors can be determined.

For the currently preferred embodiment, the power discharge equation for the power source supplying power to transmitter (200) is known. Transmitter (200) executes a software routine that tracks power usage. Transmitter (200) comprises a circuit that monitors the voltage level of the power source and the current flowing from the power source and the amount of time such current is flowing from the power source. Such power usage is converted to a counter value that is stored in memory and directly relatable to such power consumption. Ironically, such power consumption monitoring is analogous to the monitoring of water consumption by utility meter. In any event, transmitter (200) may be further configured to compare the power consumption value to the batteries amp/hour rating to determine the expected remaining life of the battery.

Alternatively, transmitter (200) contains a lookup table containing the power consumption values for task performed by transmitter (200). Transmitter (200) then tracks the amount of power used over time and subtracts that value from the rated power life value to determine how much power remains within the battery.

For the above embodiment, transmitter (200) may further track statistical data that measures the amount of power used over time (such as average power consumption). For example, suppose transmitter (200) is powered by a 20 amp/hour battery (to keep the example easier to follow the values may not represent realistic values for the real world). Further suppose that transmitter (200) has determined that it has used 15 amp/hours of energy in total and that it uses an average of 0.1 amp/hour per month. With such data, transmitter (200), or a user, can calculate that the power source has 15 amp/hours remaining (20−15) and such energy should be depleted 50 months (5/0.1=50).

Notably, transmitter (200) may be configured to perform the above calculations and transmit an expected battery life remaining value to a remote location. Alternatively, transmitter (200) may simply transmit the associated data to a remote device and a remote device may perform the necessary calculations to determine the expected battery life remaining.

RF Energy Scavenging

For the next alternative embodiment of the invention, the power source for the transmitter associated with the utility meter includes RF energy scavenging technology. Such RF scavenging technology is configured to convert ambient RF energy (to DC energy). Such RF energy may be broadcast by electronic devices such as cellular telephones, radio stations, television broadcast stations, computer networking systems, and many others. One of ordinary skill in the art will appreciate that a significant amount of transmitted RF energy goes unutilized. For example, a signal transmitted by a cellular telephone propagates too many locations, including the antenna design to receive such signal. Such unused energy can be intercepted, converted to DC energy, and utilized by other circuits at virtually no cost to the user. The systems using RF scavenging technology may be battery free systems or hybrid systems using both RF scavenging technology and batteries.

As noted above, one configuration using RF scavenging technology includes a photovoltaic raydome electrically associated with a battery. For such configuration, the output of the photovoltaic raydome may be the only power source used by transmitter (200) or may be used to power both electronic circuits within transmitter (200) and provide a trickle charge to a battery. Such a system is referred to as a hybrid system. For such systems, the photovoltaic raydome may be used to power low power consumption circuits such as a timer circuit and monitoring circuits and the battery would be used for more power hungry functions such as transmitting an RF data signal over long distances.

For yet another embodiment, a battery free configuration is presented. For this embodiment of the invention, a 3.7 V power source is replaced with RF scavenging technology such as an RF-DC converter. A suitable RF-DC converter is manufactured by POWERCAST®. Alternatively, a discrete RF-DC convert circuit may be incorporated into the transmitter (200) circuit board design. Further, such RF-DC converter may be used to charge energy storage devices such as capacitors, supercaps, and for some configurations, a "hybrid battery" (i.e. a supercap merged with a batter).

When using the RF scavenging technology configuration, the system is configured to address several performance constraints including: (a) the power level of the signal transmitted by the intentional radiator (i.e. the RF source that generates the charging signal such as a cellular telephone), (b) the distance between the intentional radiator and transmitter (200) comprising the RF-DC converter, the type of receiving antenna used by transmitter (200), and the frequency of the intentionally transmitted RF signal (i.e. the cell phone signal, for example).

For one configuration, transmitter (200) is incorporated into the pit lid along with the scavenging-antenna connected to the RF scavenging circuit. Preferably, such is a trace antenna that provides a plurality of selectable connection points between the RF scavenging circuit and the scavenging-antenna. Each connection point would have its own electrical length and associated size. Processor (200) is then configured to select the antenna that provides the best power to the RF scavenging circuit.

Yet another consideration is to configure transmitter (200) to minimize power consumption particularly when transmitting a data signal. For one configuration, the above described real time clock (preferably requiring only nano-amps of power) is used to keep track of time (as described above) and is configured to wake up transmitter (200) via a predefined schedule. Such predefined schedule may be for transmitter (200) to wake up and transmit a data signal or for the transmitter (200) to wake up and listen for a data signal. Such wakeup schedule may also be based upon the amount of time required for the RF scavenging circuitry to generate enough power to perform a desired task. Such desired tasks are stored in a lookup table along with the anticipated power needed to perform such task. When transmitter (200) wakes up, it determines the amount of power available, determines what tasks need to be performed, and determines which of those tasks can be performed based on the available power and performs such tasks.

For the presently preferred embodiment, the system is also configured to minimize power consumption during operation. Transmitting a data signal can easily be the most power-hungry function that transmitter (200) performs. To minimize the power consumption during transmissions, the transmission time should be kept to a minimum. Consequently, to keep transmission times to a minimum, the amount of data transmitted should be kept to a minimum. To keep the transmitted data to a minimum, a simplified communication protocol may be used thereby reducing data signal overhead. Further, the amount of utility data transmitted may be reduced to shorten transmitter on time.

Additionally, for some configurations, a local receiver is used to receive the transmitted data signal to minimize transmission distances thereby minimizing the required power level required to transmit a data signal over such distance. Such local receiver will retransmit such data to a remote device. Preferably, such local receiver would be powered by the utility grid power source. For example, for one embodiment, the local receiver would be a remote display module positioned in a water consumer's home and connected to the homes power source. Such remote display technology is disclosed in commonly owned application Ser. No. 12/050,123, the entire contents are hereby incorporated by this reference for all that it discloses for all purposes. For yet another embodiment, the local receiver may be associated with a fire hydrant. Such technology is disclosed in commonly owned application Ser. No. 12/159,360, the entire contents are hereby incorporated by this reference for all that it discloses for all purposes.

Remote Transceiver

Embodiments of the remote transceiver hardware are now considered. For this embodiment of the invention, the remote transceiver includes functionally-self-healing features. For this document, functionally-self-healing means that a hardware device is capable of compensating for certain hardware failures so that the system still functions. The main function of the system may be degraded in some manner, but the overall main function is still provided. The hardware is not self-healing, only self-compensating. Restated, technically speaking, if a piece of hardware fails or is physically damaged, such hardware will remain damaged until repaired or replaced by a human. However, the present invention can compensate for hardware failures by reallocating system resources. For example, for a functionally-self-healing system according to embodiments of the present invention, a hardware failure may slow the system down, but the main function of data collection is still provided.

Figure 12:
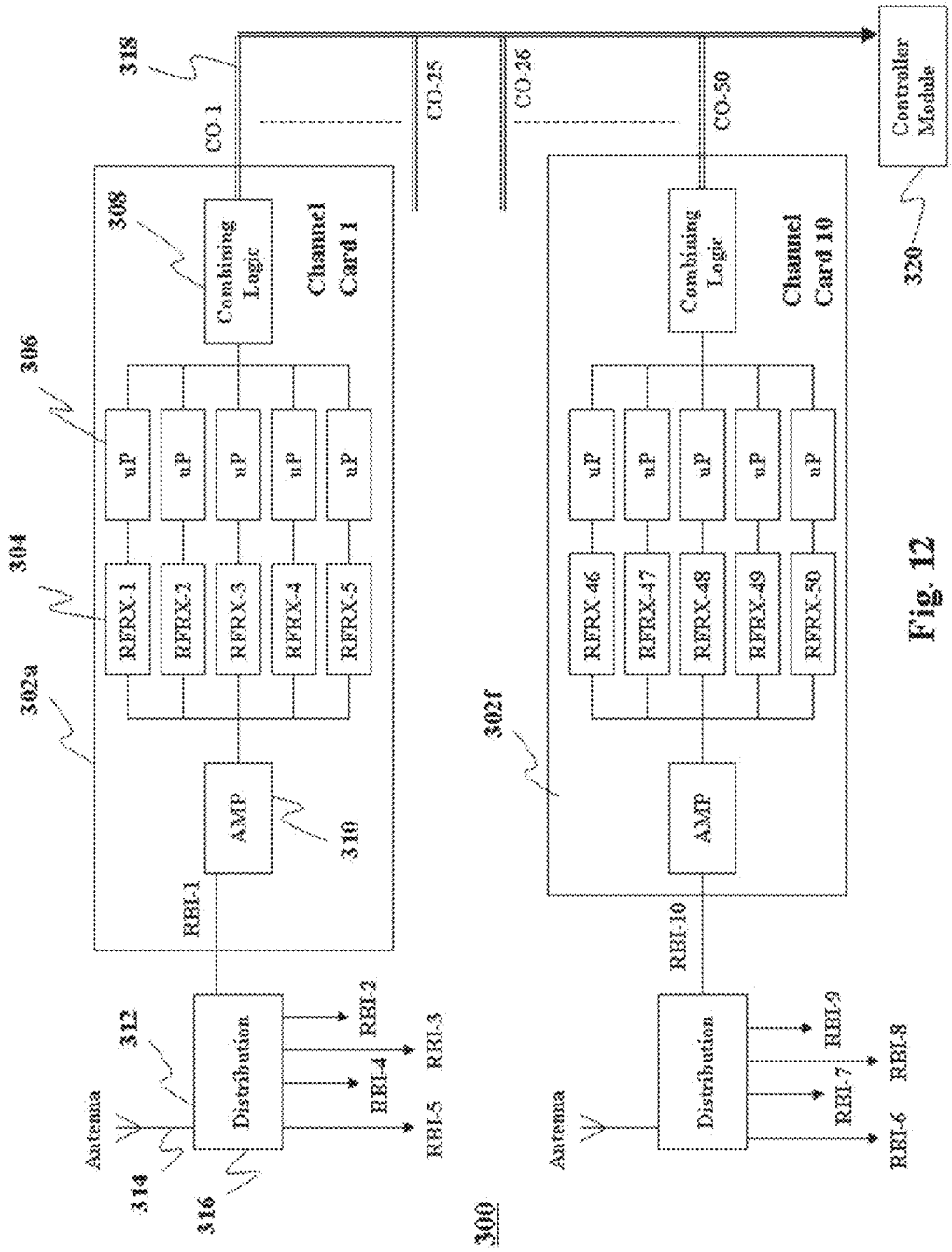
FIG. 12 is a block diagram illustration of one embodiment of a receiver module for a data collector.
Figure 13:
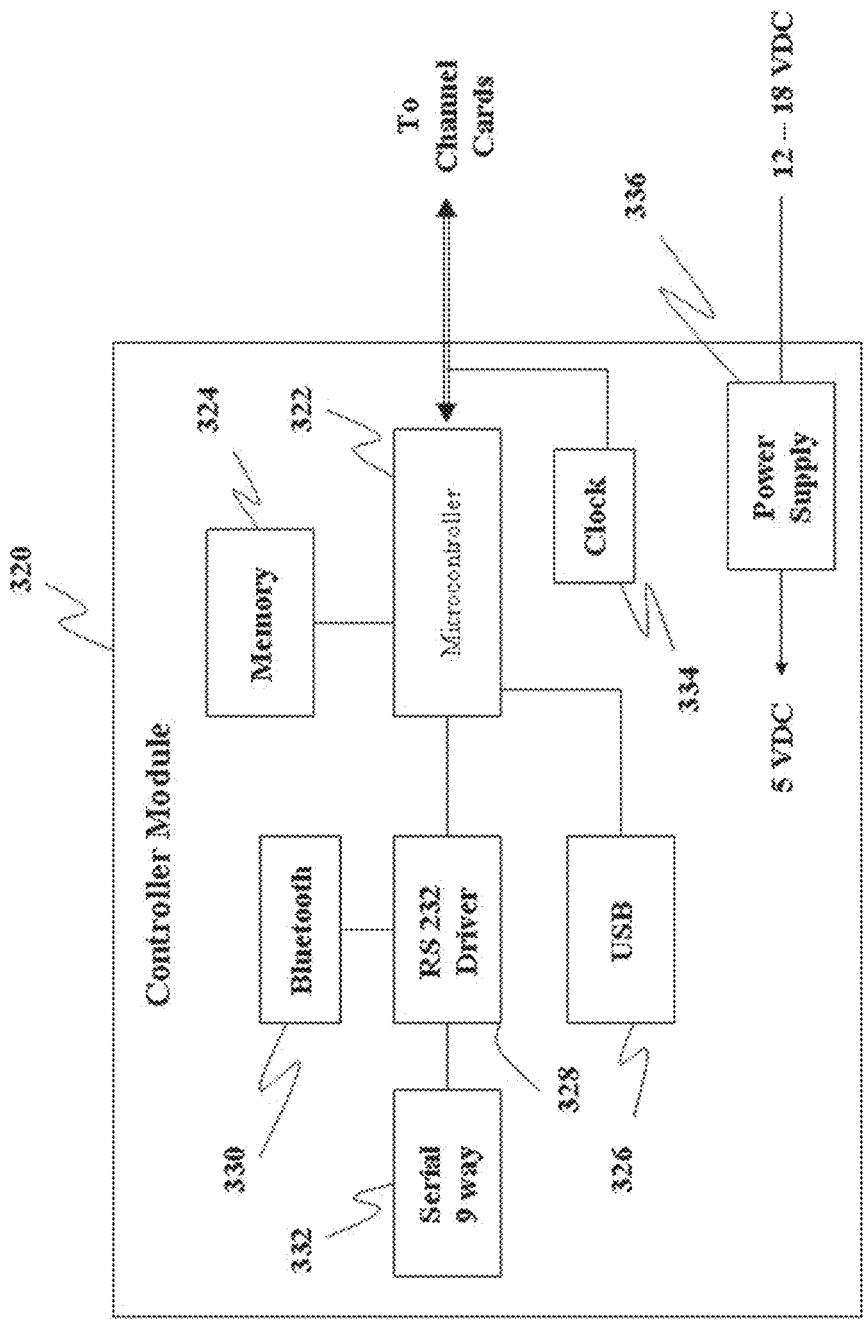
FIG. 13 is a block diagram illustration of one embodiment of a controller module for a data collector.

Referring now to FIG. 12 and FIG. 13, one exemplary embodiment of a data collector is presented. For the presently preferred embodiment, the data collector is a two section apparatus comprising a receiver module (300) electrically associated with a controller module (320) via a communication buss (318).

Receiver module (300) comprises two receiver board sets. Each receiver board set comprises five receiver-boards (302) for a total of ten receiver boards (302*a*-302*f*) (2 sets×5 boards per set=10 boards). Each receiver-board (302) comprises five programmable receivers (304) for a total of 50 receivers (304) (10 boards×5 receivers per board=50 receivers). Receiver (304) may also be referred to as a receiver channel.

For the first receiver board set, each receiver-board (302) is electrically associated with antenna (314) via a distribution circuit (316). The first receiver board set comprises receiver-board (302*a*) through receiver-board (302*e*, not shown).

Distribution circuit (316) defines signal input (RBI-1) which is electrically associated with the input of receiver board (303*a*). Distribution circuit (316) defines signal input (RBI-2) which is electrically associated with the input of receiver board (302*b*). Distribution circuit (316) defines signal input (RBI-3) which is electrically associated with the input of receiver board (302*c*). Distribution circuit (316) defines signal input (RBI-3) which is electrically associated with the input of receiver board (302*c*). Distribution circuit (316) defines signal input (RBI-4) which is electrically associated with the input of receiver board (302*d*). Distribution circuit (316) defines signal input (RBI-5) which is electrically associated with the input of receiver board (302*e*). Thus, all receiver boards receive substantially the same signal input.

Referring now to one receiver-board (302*a*), the RBI-1 input signal is electrically associated with the input of AMP (310). The output of AMP (310) is electrically associated with each of the five receivers (304) (RFRX-1, RFRX-2, RFRX-3, RFRX-4, and RFRX-5). Each of RFRX-1 through RFRX-5 are electrically associated with its own microcontroller (306). The output of each microcontroller (306) is electrically associated with combining logic (308). The output of combining logic (308) is electrically associated with controller module (320) via buss (318).

Suitable technologies for receivers (304) include programmable RF chips manufactured by Texas Instruments. Suitable technologies for microcontroller (306) include PICs manufactured by Microchip. Lattice Semiconductors manufactures suitable devices for performing the logic combining (308) functions.

One of ordinary skill in the art will appreciated that the above discussion for receiver board set 1 equally applies to receiver board set 2. Similarly, the above discussion for receiver boar (302*a*) equally applies for all receiver boards (302*a*-302*f*).

Each receiver channel functions independent of the others. For the presently preferred embodiment of the invention, each receiver channel circuit decodes the received data signal and checks such data for validity. If the data is valid, such data is transferred to the controller module (320). IF the data is invalid, the data is simply discarded. Such functionally distributes the data handling overhead amount all the channels allowing processor (322) to perform other tasks.

In addition, each microcontroller (306) monitors its respective receiver (304) and determines if there has been a channel failure. If a failure is detected, microcontroller (306) notifies processor (322). Processor (322) then generates the necessary control signals and transfers such control signals to a working receiver channel. Such control signals instruct the microcontroller (306) for the working channel to retune its receiver to the channel for the damaged receiver.

For example, assume receiver RFRX-1 is monitoring channel 1 and RFRX-10 is monitoring channel 10. Now assume RFRX-10 fails. The microprocessor (306) for RFRX-10 detects the failure and reports such failure to processor (322). Process (322) generates the necessary control signal to instruct the microprocessor (306) associated with channel RFRX-1 to tune to the RFRX-10 channel or channel 10. After receiving a data signal on channel 10, microprocessor (306) then retunes RFRX-1 back to channel 1. After receiving a data signal on the channel 1, microprocessor (306) tunes RFRX-1 back to channel 10. Such process continues until the damaged hardware is repaired or replaced. Thus, such a configuration is one example of a functionally-self-healing system.

Similarly, if an antenna (314) fails, an entire set of receivers is taken out. Under such conditions, processor (322) is configured to generate the necessary controller signals to instruct microcontrollers (306) for good receiver set to tune into the damaged receiver channels as described above. Preferably, each channel for the good receiver set would monitor two channels.

Referring now to FIG. 13, the controller module (320) is considered. Controller module (320) comprises processor (322). Processor (322) is preferably a PIC such as the ones manufacture by Microchip. The reference frequency for the system is generated by a very accurate and stable oscillator (334). Processor (322) generates receiver control signals that are transferred to individual receiver microcontrollers (306). Such control signals tell the microcontroller (306) which channel its corresponding receiver should be tuned. For example, Processor (322) generates and transfers a control signal to the microcontroller (306) electrically associated with RFRX-1. Such control signals instruct microcontroller (306) to tune RFRX-1 to channel 1 (where channel 1 is a frequency). Processor (322) generates similar control signals for each of the microcontrollers (306) thereby causing each receiver (304) to be tuned to a different channel thereby creating a 50 channel receiver system.

An exemplary data-signal comprises a meter reading, a meter identification number and status information (meter status, transmitter status, etc.). Once controller module (320) receives such data from the receiver module, such data is transferred to a data storage device electrically associated to the controller module. The connection between the data storage device and the controller module may be a serial connection (328), USB (326), or a wireless connection (330). One embodiment of a storage device is a laptop computer.

Exemplary transmission schemes are now considered. For the presently preferred embodiment of the invention, transmitter (200) is a frequency hopping spread spectrum (FHSS) transmitter. Transmitter (200) is configured to transmit a data-signal on any one of 50 possible frequencies according to the above described transmitter sequence. It should be appreciated that each frequency could be referred to as a channel. Transmitter (200) is programmed to use each channel equally. The selected channel order is randomly selected. When a channel is used, such channel is marked as used. When the next transmission is generated, the data-signal is transmitted on a channel that is not marked as used. When all channels are marked as used, all are marked unused and the process starts over again. It should be appreciated that the 50 transmitter channels are at the same frequency as the 50 receiver channels.

For one embodiment, a dual diversity antenna system is used. For this configuration, the FHSS system will have two antennas, each configured to receive twenty channels with one antenna receiving even numbers and the other antenna receiving odd numbers. The system will automatically switch modes/antennas. Such a configuration gives the receiver the ability to listen twice to minimize any skips, noise, or similar issues that may impact the receiver on the first try. Further, if one side of the dual diversity system is not functioning correctly, the other side should pick up the entire transmission thereby providing an automatic backup feature.

For yet another alternative embodiment, the remote data collector provides a direct connect feature allowing a user with a suitable device (such as a laptop computer) to direct connect to the data collector and retrieve data. Such a system configuration would be similar to a walk by system in that a person may walk up to a data collector and manually retrieve data for a plurality of devices at one location. It should be obvious that such a feature, while not as "automatic" as a completely wireless system, provides a much more efficient method of reading such plurality of meter. Similarly, a person may simply drive by and retrieve the data from the data collector via an RF communication link.

For yet another embodiment of the invention, a coded wake-up signal used. For this embodiment, the remote receiver transmits a coded wake-up signal configured to instruct a transmitter (200) associated with a utility meter to perform a predefined function. For example, the coded wake-up signal can instruct the transmitter (200) which transmitter modes should be used (i.e. drive-by, walk by, fixed network, etc.). Such wake-up signal can also instruct transmitter (200) that a service/diagnostic signal will follow. Examples of service/diagnostic signals include firmware upgrades, diagnostics, time checks, battery life check, transmitter level check. Yet another coded wake-up signal can instruct the transmitter (200) that utility resource consumption data is desired. Further, such coded wake-up signal can wake up only a subset of utility meters thereby not wasting power by waking up utility meters containing data that is not currently desired.

For systems using uncoated wake-up signals, unwanted "adjacent data" may be collected by a data collector. "Adjacent data" is defined as data from a utility meter, containing currently unwanted data, where such utility meter transmits a data signal in response to a received wake-up signal (or transmitted according to a predefined transmit time interval) and such adjacent data is received by the data collector Traditionally such unwanted data is deleted. For one alternative embodiment of the invention, the data collector is configured to identify the unwanted data as "adjacent data" and transmit such data to the end-user. The end-user can then determine whether or not his to disposed of such "adjacent data". Notably, one of ordinary skill in the art will understand that there is nothing special about the term "adjacent data" and any term may be used to refer to unwanted data.

Universal Two Way System

Figure 14:
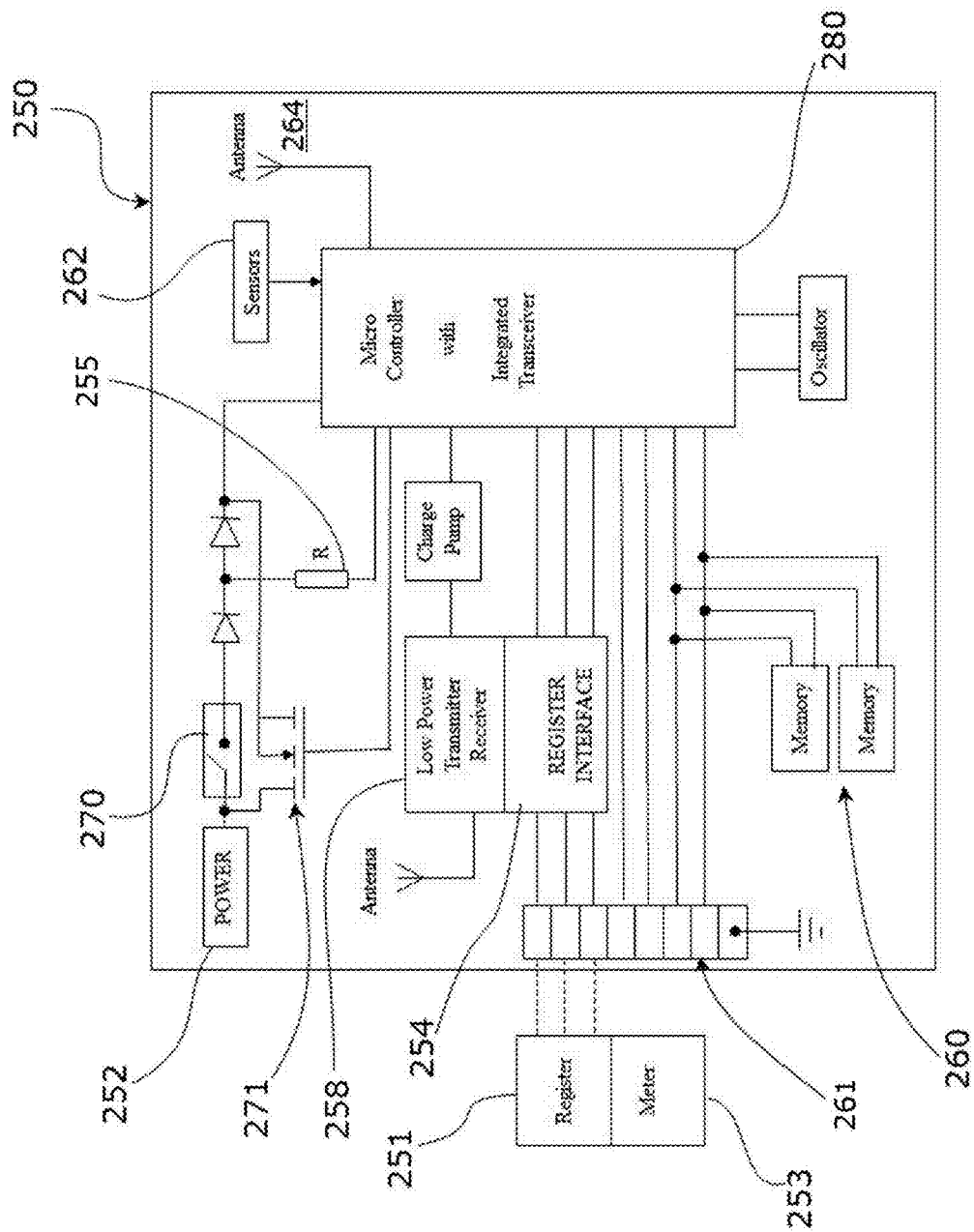
FIG. 14 is a block diagram illustration of one embodiment of a MIU device.

Referring now to FIG. 14, one alternative embodiment of a multi-purpose wireless meter interface unit (MIU) (250) configured for operation with a wireless reading collector or interrogator (282, FIG. 17) is presented. Initially, it should be appreciated that MIU (250) is another embodiment of a communications device (40) described above and interrogator (282) is another embodiment of a receiver module (300).

Consistent with the technology disclosed above, the currently preferred AMR system comprises a MIU (250) in communication with an interrogator (282) (or some other receiver module) and is configured to be used in either a walk-by, drive-by, fixed network, or sub-metering mode/application where the MIU (250) is configured to support such modes of operation without hardware modifications. The MIU (250) is preferably a self-contained module mechanically and electrically associated with a replaceable battery pack (252). The MIU will be connected with a meter register (14, FIG. 1; 251, FIG. 14) and will define at least one dual mode register interface (254) capable of reading pulse and digitally encoded registers.

For one embodiment, the MIU (250) will be contained in a two-part plastic enclosure. The first enclosure (circuit board enclosure) will contain the main printed circuit board and antenna (264) fully encapsulated in a potting compound. The second enclosure (power enclosure) will contain an encapsulated power source (252). For the current embodiment, power source (252) will be battery pack (252). Such power enclosure will attach firmly and positively to the circuit board enclosure using any suitable releasable technology including snap fittings and/or hinge mechanisms and will be removable to allow field replacement of the battery pack (252).

The circuit board enclosure will support wall and pit mounting via a multi-purpose mounting bracket allowing the MIU (250) to be mounted to a pipe in a pit by running straps through the openings on either side of the bracket. Similarly, the MIU may be mounted on a wall using a wall mounted adapter that snap fits with the circuit board housing. Preferably, the MIU (250) housing is waterproof for MIU environments where the MIU may become submersed in a liquid. For wall mounted applications, the MIU housing is water resistant.

A charge pump (256) is provided to boost the voltage supplied by power (252).

The sensors (262) may be any number of sensors including temperature, GPS, acceleration, water, electromagnetic interference (EMI), and light.

Antenna (264) may be housed in the first housing (circuit board housing) or it may be an external antenna.

Communication between meter (253) and MIU (250) is achieved via either wired register interface (254) and/or wireless register interface (258). Low power transmitter (258) may be used to communicate with any suitably configured Register (251). Low power transmitter (258) may be any suitable low power consumption technology such as Bluetooth. A more detailed description of the wired register interface (254) is provided below.

The controller (280) circuit includes additional non-volatile memory (260) in the form of one or two IIC EEPROM integrated circuits. This off-chip non-volatile memory (260) is used for: Data logging; Event logging; and Configuration parameter storage.

The embodiments of the MIU (250) device described above provide various features which will be discussed in detail below and include: a replaceable battery pack (252) such as a battery pack comprising 4×AA batteries arranged in a 3V, 5.9A-H configuration; a programmable operating schedule; support remote wakeup, scheduled wakeup, and bubble-up communication modes; provide at least 10 years of operation under normal drive-by operating conditions; sending a 32-bit time reference to reader receiver that will be used by the MIU to calibrate its internal real-time-clock (RTC); supporting in-field configuration over the air; a magnetically activated configuration interface (270) that allows the interrogator (282) (using a special Windows application, to perform maintenance) read the data log and change configuration parameters as well as provision the MIU; support in-field firmware updates over the air; log readings at configurable intervals to non-volatile memory (260) where the size of the data log buffer will be user configurable using a circular buffer where the oldest readings will be replaced with the newest readings when the buffer becomes full; log events to non-volatile memory (260) where each log entry will include a timestamp, an event code, and a variable length data record. Log events include: Power on, Power off, Enter configuration mode, Exit configuration mode, Firmware update, Tamper detect, and Fault detect.

Still referring to FIG. 14, preferably, the MIU (250) will be installed with the battery pack (252) mechanically connected to the MIU but electrically disconnected from the MIU circuit via a magnetic element (270) (e.g. reed switch). When the installer places a magnet near magnetic element (270), power is applied to controller (280). Restated, the controller is electrically associated with a magnetically activated configuration interface comprising a magnetic component wherein said magnetic component blocks power from said magnetically activated configuration interface when not actuated and wherein said magnetically activated configuration interface is configured to generate a configuration signal when said magnetic component is actuated thereby signaling said MIU to enter configuration mode.

One embodiment of a controller (280) is a microcontroller described in detail later. When power is applied to controller (280), it comes out of reset and begins executing code and turns on a latching element (271). One suitable embodiment of a latching element (271) is a transistor that shorts across the magnetic element (270), when the transistor is on and conducting, thereby keeping the MIU (250) powered on after the magnet is removed.

For one embodiment, with MIU (250) powered on, magnetic element (270) provides a second function. While the MIU (250) is powered and in a predefined mode (such as an active sleep mode), a magnet is used to actuate magnetic element (270) thereby placing a voltage at configure-detector-element (255) and signaling the controller (280) to enter configuration mode. For one embodiment, configure-detector-element (255) is a resistor. Notably, detector-element (255) may be eliminated so that a voltage signal is applied to an input of controller (250). Regardless of the form, such signal is referred to as a configuration-signal.

Magnetic Security Feature

It is well known that hackers will frequently try to gain unauthorized access to devices that utilize wireless communications. If a hacker were able to gain unauthorized access to a plurality of MIU (250) devices, such hacker could disable an entire AMR network, or a large section of an AMR network, from one remote location.

For one exemplary embodiment, magnetic element (270) and configure-detector-element (255) are used to provide a security feature. Preferably, the MIU (250) is programmable so that firmware upgrades and configuration updates/modifications are only allowed during a specific time and/or when the configuration-signal is present. It should be appreciated that if one is required to use a magnet to actuate magnetic element (270) before remotely configuring a MIU (250) device, a hacker would have to travel to each individual MIU (250) installation site. Unfortunately, if the owner of a plurality of MIU (250) devices wishes to update the firmware on all of his devices, such owner would also have to travel to each individual installation site to manually actuate magnetic element (270). Therefore, for one alternative embodiment, local activation of magnetic element (270) is not required to enter configuration mode. Instead, MIU (250) is configured so that its firmware or configuration can be remotely modified according to a previously defined configuration method and schedule using a security feature such as a password.

Power

Power pack (252) and the associated control circuitry are now examined in more detail. For the currently preferred configuration, the replaceable power pack (252) for the MIU (250) comprises a LiFeSO2 primary chemistry battery pack arranged in two parallel strings of two series cells for a total nominal voltage of 3.0V and capacity of 5.9 A-H. The power pack (252) is configured to be field-replaceable and is contained in its own encapsulated plastic housing mechanically associated with the bottom of the MIU (250) enclosure using any suitable attachment means such as snaps. For one embodiment, the power pack (252) will connect to the MIU by splicing the wires with small water proof telecom splicing connectors or the previously disclosed connector technology.

For the currently preferred embodiment, there is no onboard power regulator for the MIU (250) circuits, with the exception of the register interface in encoder mode. As noted previously, the controller (280) and wireless transceiver coexist on the same integrated circuit, and therefore, their respective power feeds will not be isolated with devices such as DC chokes. Instead, the power supply will be adequately bypassed and filtered at all supply points, with high-frequency bypass at RF power supply points.

MIU Turn On

When the battery pack (252) is initially attached, the MIU (250) will remain in the off state. To power up the MIU (250), magnetic element (270) is engaged with a powerful rare-earth magnet. When the magnetic element (270) is engaged, power is applied to the controller (280). A de-bounce element (263) may be provided on the output side of magnetic element (270). One exemplary embodiment of a de-bounce element (263) is a capacitor (typical value being 100 uf). As soon as the controller (280) powers up and comes out of reset, it turns on a latching element (271) that bypasses the magnetic element (270) thereby latching power on. One exemplary latching element (271) is a transistor. After latching, the magnet can be removed and power will still be supplied to the MIU.

For one embodiment, the magnetic element (270) will have at least one gate-element (259) on its output that becomes forward biased and conducts allowing current flow when magnetic element (270) is actuated. For the embodiment in FIG. 14, the gate-element comprises two diodes in series and the node between the two diodes is electrically associated with configure-detector-element (255) (e.g. a pull-down resistor). When MIU (250) is in a predefined power on mode, and magnetic element (270) is actuated, a voltage will be applied to configuration-detector-element (255) signaling MIU (250) to enter configuration mode. Stated differently, a voltage or current value will be monitored at component (255) by the controller (280). If the monitored value meets predefined criteria, controller (280) enters configuration mode where its firmware, configuration, and programs may be updated/upgraded.

Further, for embodiments where there is no configuration-detector-element, a voltage is applied to an input pin of controller (280). Whether a voltage or current is detected, the MIU (250) will be placed into configuration mode.

Figure 15:
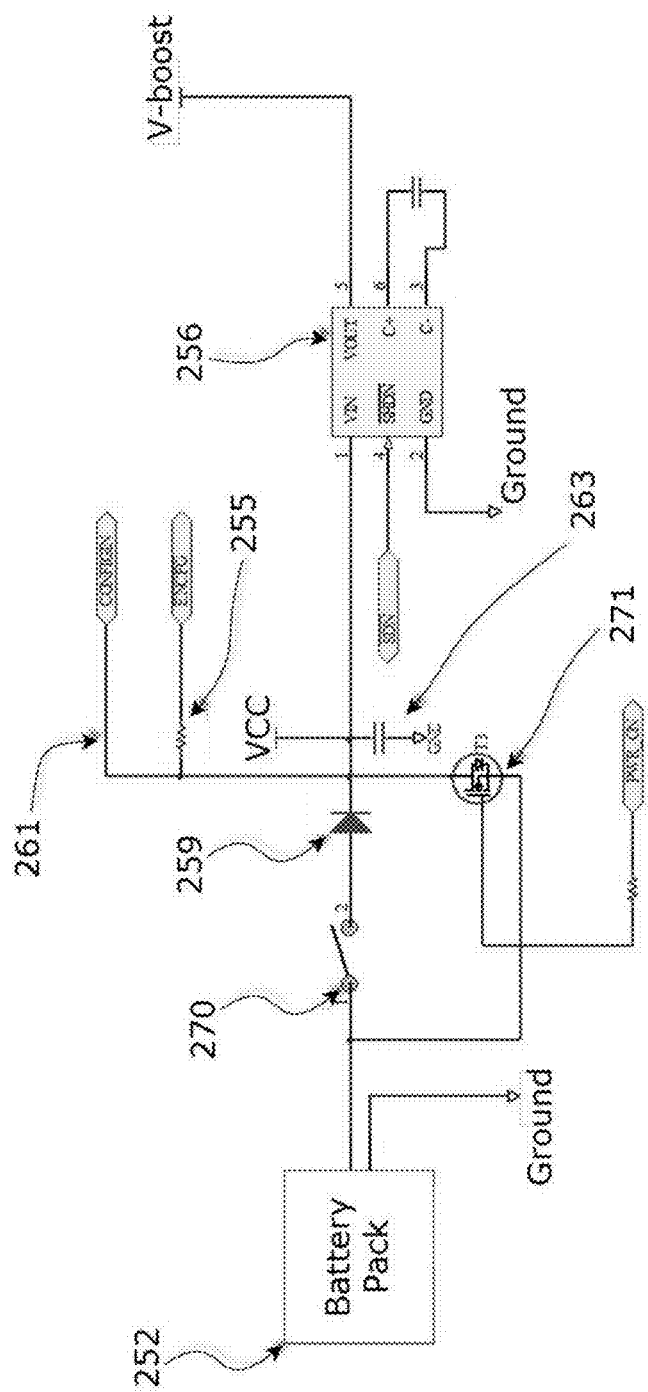
FIG. 15 is a block diagram illustration of one embodiment of a power up circuit.

Referring now to FIG. 15, yet another alternative embodiment for the power turned on and configuration circuit is disclosed. For this embodiment, one diode is used at the output of magnetic element (270) and configuration-detector-element (255) is a pull down resistor. When actuated, the magnetic element (270) connects power (252) to gate-element(s) (259) thereby allowing current flow to configuration-detector-element (255) thereby generating a configuration-signal. As noted above, one exemplary embodiment of a gate element is a diode. Such configuration-signal is detected by controller (280). Controller (280) will periodically (or according to a predefined schedule) electrically associate pull down resistor (255) to ground (or some other reference point) and check for an electrical parameter (such as voltage or current) at configuration input (261) for controller (280). If the proper electrical parameter is present (configuration-signal), magnetic element 270 has been actuated and the controller (280) will enter configuration mode.

Register Interface

Figure 16:
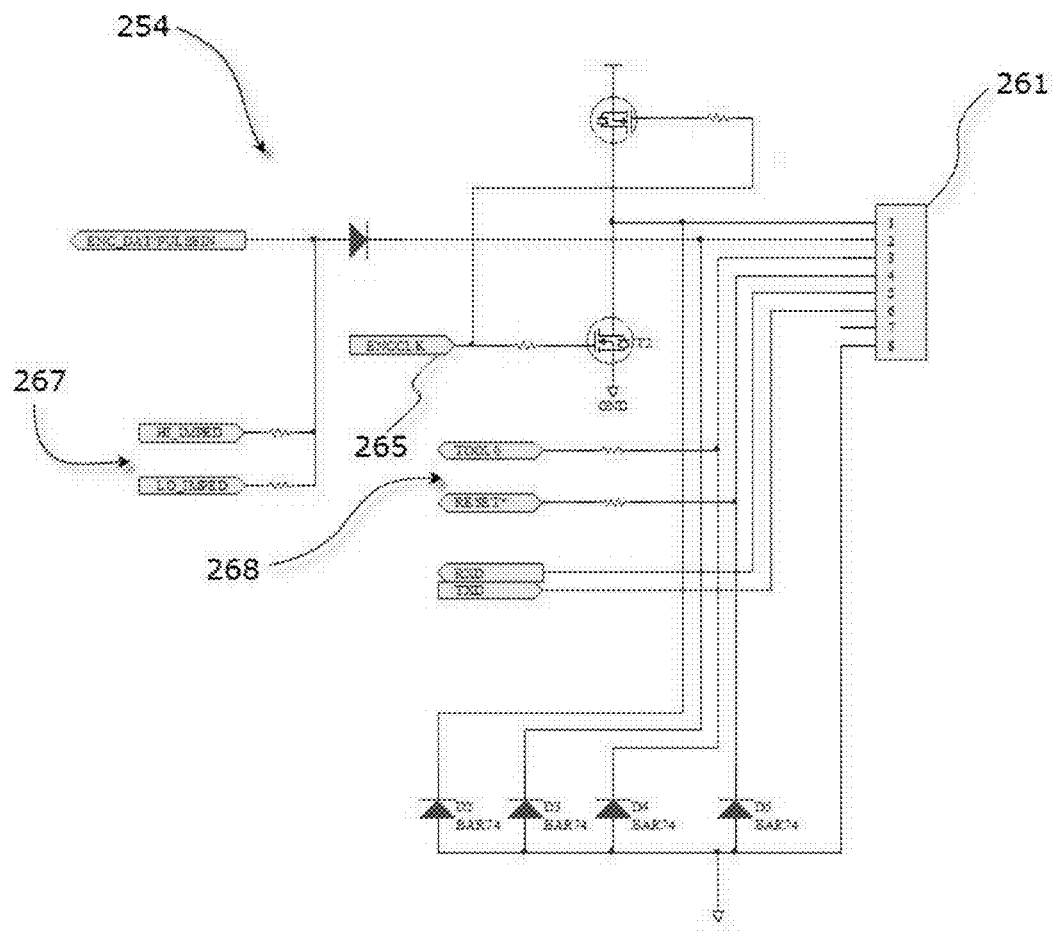
FIG. 16 is a block diagram illustration of one embodiment of a universal register circuit.

Referring now to FIG. 16, one exemplary embodiment of register interface (254) is considered in more detail. The MIU (250) printed circuit board comprises an eight position wire-to-board connector (261) that will be used to connect via wires to a monitored register (251, FIG. 14). The register interface (254) is configured in such a way that it will support either a pulse or a digitally encoded register. The particular mode that the interface operates in is determined by the MIU (250) configuration settings.

The following is an exemplary list of supported register modes for the currently preferred embodiment:
1. Channel A single pulse—in this mode, pulses are counted on channel A
2. Channel B single pulse—in this mode, pulses are counted on channel B
3. Quadrature pulse with channel A leading—in this mode, both channels are used to count pulses from a dual pulse output register. If channel A pulse is leading channel B, the water flow direction is positive and each A-B pulse counts as one. If channel A pulse is lagging channel B, the water flow direction is negative; each B-A pulse counts as negative one.
4. Quadrature pulse with channel B leading—this mode is identical to the above mode except that the directions are reversed for A-B and B-A pulses.
5. Digital encoder in this mode, the register interface generates a 5V clock signal (265) according to a desired specification such as the "Schlumberger specification". Data is read on the data pin. Channel A in pulse mode is shared with Clock in encoder mode. Channel B is shared with Data.

Controller (280) and register interface (254) further support a plurality of encoder protocols. To support a wide range of pulse registers, the register interface (254) is capable of biasing the channels with a high or low impedance pull-up resistor (267). The pull-up that is used is controlled by the firmware in the controller (280). The firmware selects the pull-up according to a configuration parameter stored in a memory.

The pulse inputs are fed into two internal comparators (internal to controller (280)) which are biased to switch at half of V-boost. The hysteresis of the comparators is combined with software based de-bouncing to ensure solid, noise free switching. As noted earlier, V-boost is generated by an on-board charge pump (256) which doubles the voltage supplied by the power pack (called V-battery). For the current embodiment, at full voltage, this V-boost supply rail will be 6 Volts and when V-battery reaches the end of its life (i.e. the cut-off voltage), V-boost supply rail will be about 4V, which is compatible with most encoded registers.

Controller (280) typically accesses register (251) to obtain meter data periodically (such as every 15 minutes). Such meter access period is user programmable. Preferably, the V-boost charge pump is turned on when reading a register and off the rest of the time to minimize power consumption. Additionally, the pulse bias resistors are turned on and off in a duty cycle that is fast enough to ensure that every pulse is received and counted while minimizing power consumption from the bias resistors. The register interface connector (261) also provides external connection points for serial and debug connections (268) to controller (280). These signals will be described in detail in the controller section.

In summary, the universal wired register (254) will: defined a dual purpose interface (register reading and system debug interfaces); provide at least a two pulse inputs and/or a clock-data encoder input; provide for user programmable configuration parameters which include: Register interface mode; Encoder protocol; Pulse input impedance; and Pulse input bias duty cycle.

For wireless register communications, a low power transmitter (258) technology is used and configured to be compatible with the register (251) transmitter technology which may be any suitable low power consumption, short range, wireless communication schemes such as Bluetooth. Further, a wired power connection may be provided from MIU (250) to register (251) that supplies the power for the register to perform at least one of: (a) register functions (i.e. counting consumption); and (b) transmitting a register-data-signal. A register-data-signal is a transmitted signal comprising data from the device associated with the register (251). For water meters, register (251) is associated with water meter (253).

Controller

Various exemplary embodiments for controller (280) are now considered in more detailed.

The MIU (250) preferably employs a controller comprising an on-chip digital spread spectrum transceiver for two way communications. The output power is user programmable with a maximum output of 1 watt.

For one embodiment, controller (280) is a Frequency Hopping Spread Spectrum (FHSS) base module and is a member of the RL78 family from Renesas defining a state-of-the-art 16-bit microcontroller and provides best-in-class power vs. speed with a maximum execution rate of 32-MIPs and provides 4K RAM and 32K flash memory.

For yet another embodiment, the transceiver is a Direct Sequence Spread Spectrum (DSSS) module based on the SX1272 RFIC from Semtech. The SX1272 is fully integrated comprising a LoRa modem, digital baseband, a RF transmit and receive chain, a receiver Low Noise Amplifier (LNA), and a transmitter power amplifier capable of up to 1-watt output power.

Such Semtech based controller (280) employs a combination of a direct sequence spread spectrum modulator/demodulator, a digital signal processor, and a forward error correction coding engine. This combination of technologies is unique in the automated meter reading application space and when combined with other components of the AMR System yields at least the following advantages:
1. Because the technology uses direct sequence spread spectrum modulation and demodulation, the resulting radio is authorized to operate under the digital spread spectrum portion of FCC 10CFR47 Part 15.247. Frequency hopping is not required, simplifying the protocol, reducing the synchronization time and therefore increasing battery life, and increasing overall reliability of the communication link. Furthermore, direct sequence spread spectrum will inherently reject non-correlated in-band interference.
2. The forward error correction coder embeds redundant encoding in the data stream which allows the receiving end to detect and correct bursting bit errors. This greatly improves reliability in the presence of real world noise sources.
3. The digital signal processor is able to execute advanced correlation algorithms so that the resulting receiver can actually receive signals that are significantly below the receiver's noise floor. A typical GFSK receiver will require a signal at least 12 dB above the receiver noise floor before it can successfully and accurately recover the transmitted data. A LoRa based receiver, on the other hand, can receive signals at least 20 dB below the noise floor, giving LoRa a minimum link budget advantage of 32 dB. Such feature allows controller (280) to transmit over longer distances using significantly transmit lower power levels. Transmitting at lower power allows the use of smaller, less expensive batteries while also extending the life span of such batteries.

Firmware Updates/Upgrades

MIU (250) firmware will be resident in the controller's (280) FLASH memory and firmware can be loaded/upgraded in at least two ways: (1) via the on-chip debug interface which can be accessed through the 8 position register interface connector (261); and (2) over the air using the built in radio.

When the MIU (250) has been installed at a user site, firmware can be updated over the air using the built in radio. To do this, controller (280) is placed in configuration mode. How the controller (280) is placed in configuration mode will be determined by an update-MIU value stored in memory and is preferably user programmable. Sample update-MIU values include: 1: Local activation required, password; 2: Remote Activation allowed with Password anytime; and 3: Remote Activation allowed with password at predefined time. For such configuration, exemplary update-MIU value comprise: the code, password, time data: the "code" is 1, 2, or 3; the password is the predefined user password; time data is the RTC time during which controller (280) configuration/firmware upgrades are allowed.

For one embodiment, as described above, if configuration code is "Code 1" (requires local activation) one must activate magnetic element (270) before performing controller (280) updates. If the configuration code is "Code 2", a simple command associated with a password is used to remote program controller (280). If the configuration code is "Code 3", a simple command associated with a password at the appropriate time of day will place controller (280) in configuration mode. Once in configuration mode, a laptop, tablet, or any suitable computing device running a proprietary application/algorithm is used to download new configuration data and/or new firmware using the interrogator (282) (or similarly enabled device) described in detail later in this document.

Power Up Sequence

On power-up, the controller (280) initializes its hardware and the hardware of the on chip transceiver. Once initialization is complete, controller (280) will turn on the power latch FET (271).

The main loop will execute the MIU-schedule. Each MIU-schedule will comprise a mode-schedule data. The mode-schedule data tells the MIU what it should be doing and when it should be doing same. The MIU-schedule is user programmable and stored in a MIU memory. Exemplary MIU-schedule and mode-schedule data will be described in more detail later.

At the top of the loop, the controller will compare the current time with a time specified by the mode-schedule data that defines a time when a particular MIU mode is active If no MIU mode is active, control passes to a wait state for a predefined period of time (such as a sleep state). After the wait state period has expired, program control passes back to the top of the loop where the current time is again compared to a mode-schedule time. If the mode-schedule data and RTC data indicates a MIU mode has become active, controller (280) sets the appropriate MIU mode configuration and the mode algorithm is executed. For the currently preferred embodiment, there are four (0 to 3) valid MIU mode algorithms include:

1. Continuous Sleep "CS" (0)—In this mode, the firmware will set an alarm in the (real time clock) RTC for the appropriate wakeup time and then enter ultra-low power sleep mode. When the RTC alarm triggers, the controller (280) will wake up and the main loop will execute again, going back into sleep if the mode has not changed. The alarm time is user programmable. For the preferred embodiment, the maximum time that an MIU will sleep in this mode is 30 minutes.
2. Active listen "AL" (1)—In this mode, the transceiver is placed in receive mode and the firmware is continuously listening to the transceiver for incoming messages. This mode is provided to allow, for example, a 15-minute period every day where the transceiver is always listening for on-demand remote access.
3. Periodic Listen "PL" (2)—In this mode, the transceiver listens for an incoming packet for a predefined length of time (e.g. 11.3 mSec; "listen time") per period; the remainder of the period is spent in sleep mode. The period can be set from 1 to 16 seconds ("listen-period"). Using such exemplary numbers of 1 second listen-time and 10 second listen-period, the MIU will wake the transceiver, tune to a channel, listen for a signal for 1 second and, if no signal detected, go back to sleep for 9 seconds. The process is repeated until controller (280) determines the mode is no longer active.
4. Periodic Transmit (bubble-up) "PT" (3)—In this mode, the transceiver will enter transmit mode at the beginning of each period and transmit the current reading. This mode emulates the popular traditional drive-by mode that most current systems use. The period can be set from 1 to 16 seconds.

For the preferred embodiment, the MIU mode is defined using an 8-bit byte. The upper 4 bits defines the mode and the lower 4 bits determines the period if applicable. A period of zero is invalid and will not be accepted for modes that require a period to be defined. The numbers in parenthesis beside the MIU mode names in the above list is just one example of the values that may be stored in the upper byte for that mode.

Internally, the controller (280) will store the current time as a 32-bit integer that marks seconds since midnight on Jan. 1, 2013. Each time the MIU receives a message from the interrogator (282), it may optionally contain a time reference that is used to correct the on-board time to calibrate out time drift due to crystal tolerances. The internal time reference is user configurable, however, when a plurality of MIUs are being used, they preferably are all set to the same internal time reference value. Where required, application software will convert the time stamp to appropriate date/time values for the time zone where readings are taken is desired.

Time Drift Rate

Typically, for a properly working MIU (250) system, the real Time clock drift rate will not exceed a predetermined value. Excessive real-time clock drift rate may be an indication of a current or future hardware issues. Therefore, for one exemplary embodiment, controller (280) maintains statistical values associated with time drift. Such time drift statistical values may be used internally by controller (280) to determine if the amount of time drift over time (rate of drift) is outside the expected values. To make such determination time drift threshold values are stored in memory. For example, from experimentation or calculated values, a maximum time drift threshold value may be stored in memory. Such a value could be, for example, 2 seconds per day. When controller (280) receives time data, before updating the real-time clock, controller (280) calculates the amount of drift that has occurred since the last real-time clock update and determines the elapsed time since such update. If the calculated time drift rate exceeds the threshold value, a flag is set indicating real-time clock drift is out of specification.

MIU Mode Schedule

The MIU mode schedule(s) are stored in the configuration memory and are user programmable. For the current embodiment, each schedule entry will include a 32-bit start time, a 32-bit stop time, and an 8-bit mode definition. The mode definition defines which of the MIU modes (CS, AL, PL, PT) are to be used. The mode will go into effect (become active) when the current time is equal to or greater than the start time. The mode will stay in effect as long as the current time is less than the stop time. A default mode is specified in the configuration settings. This mode is used for time periods where no schedule item is specified. If no MIU schedule is specified, the default mode will be perpetually active.

Data Logging

For one exemplary embodiment, the controller (280) will take a reading via the register interface (254) at a user configurable interval. Such interval is set in the configuration settings. The controller (280) can log the reading to the data log memory. For example, if the interval is one (1), then each reading is logged. If it is two (2), then every other reading is logged. If the interval is zero, the data logging feature is disabled.

Event Logs

For one embodiment, the controller (280) is configured to monitor and generate MIU data that represents "events" wherein such MIU data comprises information about the status of the MIU and wherein such MIU data (or "events") are stored in an event log. This log is useful in post mortem analysis to determine the chain of events that led to a failure. The previously described time drift value is part of the event log events monitored. Other events monitored depend and on the sensors (262) associated with controller (280). For embodiments including an acceleration sensor, such sensor is configured to detect movement. One of ordinary skill in the art will appreciate that once a MIU is installed in the field there should be very little movement. Detecting movement is an indication of tampering. Therefore, if controller (280) detects movement, a movement tamper flag is set. For another embodiment sensor (262) includes a temperature sensor. If the temperature sensor generates temperature data indicating that the environment surrounding the MIU (250) device has dropped below freezing, a freeze warning is issued indicating possible damage to the water meter (253). For yet another embodiment, a water sensor is associated with controller (280) and is configured to generate a signal indicating that MIU (250) is immersed in water.

For yet another embodiment, a light sensor may be associated with controller (280). One exemplary embodiment of such a light sensor is a photovoltaic device. For embodiments where MIU (250) is installed in underground pit, a voltage generated by such light sensor would indicate that someone has accessed the installation site which may be an indication of tampering. For this configuration, a light detected event flag is generated.

For yet another embodiment, an EMI sensor may be associated with controller (280). Such EMI sensor may be used to detect spurious electromagnetic energy in the vicinity of the MIU (280) device. The timing and duration of such EMI interference can be logged. If the electromagnetic interference occurs at the same time every day, the schedule for reading such meter can be modified accordingly to avoid such interference. Additionally, real-time electromagnetic interference consistent with lightning strikes in the area may be detected by controller (280). When lightning strikes are detected, the controller (280) can actuate a switch isolating the MIU (280) antenna (264) from the transmitter circuitry to prevent damage.

Each event log entry includes a 32-bit timestamp, an event code, and a variable length data record with information pertinent to the event. In addition to the above described events, exemplary valid events include: Power on (0)—no data record; Power off (1)—no data record; Firmware upgrade (2)—data record includes technician number and old revision number; Tamper detect (3); Enter configuration mode (4); Exit configuration mode (5); and Configuration mode timeout (6)—this event happens when the MIU is placed in configuration mode using the magnet but no radio connection is made within the configurable timeout period. The timeout period is set in the configuration settings.

The controller (280) will store two non-changeable values in memory: the current firmware revision and the MIU's internal serial number. The internal serial number is a 32-bit number that is used to uniquely identify the MIU for configuration and reading purposes. The serial number is set at the factory and cannot be changed and the firmware revision is set automatically when the firmware is updated. Such internal serial number is associated with a warranty value to track and update warranty information as will be described in more detail later.

MIU Transceiver

As noted previously, MIU (250) configurations can employ either a frequency hopping spread spectrum transceiver, or a direct sequence spread spectrum transceiver to provide two way communications between the MIU (250) and a remote interrogator (282). That said, the examples below are for the MIU (250) configurations employing the SX1272 RFIC from Semtech unless indicated otherwise.

One of ordinary skill in the art will appreciate that the transmitter has the largest power demand of the MIU components and the use of such transmitter will likely be the most significant factor affecting the life of the MIU power pack. For the current embodiment, the transceiver can operate in 5 different transceiver modes.

Please note that controller (280) operates in what are referred to as MIU modes (as described above). Controller (280) comprises several electronic components including a transceiver. The Controller (280) transceiver also operates in what are called "transceiver modes". Care should be taken not to confuse the two.

The following table shows the transceiver modes along with their accompanying usage power levels and settling times:

| | Mode | Direct Sequence Power Consumption | Direct Sequence Settling Time | Frequency Hopping Power Consumption | Frequency Hopping Settling Time |
|---|---|---|---|---|---|
| 1 | Sleep | 100 nA | NA | 100 nA | NA |
| 2 | Ready | 1.2 uA | NA | 1.2 uA | 330 uSec |
| 3 | Tune | 4.5 mA | NA | 9 mA | 80 uSec |
| 4 | Receive | 10 mA | NA | 16 mA | 4.7 mSec |
| 5 | Transmit | 125 mA-100 mW 28 mA-20 mW 18 mA-10 mW | Not Specified | 130 mA-100 mW 45 mA-20 mW | Not specified |

As noted in the table above, for the configuration of MIU (250) using the direct sequence transmission scheme, no settling time is required.

Preferably, regardless of the MIU profile, the transceiver will operate in the sleep-mode most of the time. When the transmitter wakes from sleep-mode, it will transition through Ready-mode and Tune-mode to Receive-mode. The Ready-mode and Tune-mode are hardware dependent and remain substantially constant for all profiles. For configurations requiring settling time, the settling time for Receive-mode is calculated based on the design parameters for the specific application.

Direct Sequence Spread Spectrum Version

For the direct sequence version of controller (280), to minimize power consumption, the transceiver will operate in the sleep state most of the time consistent with a predefined Sleep-RX-Sleep cycle which is now considered.

"Sleep" simply refers to a "sleep mode". "RX" refers to the act of using the MIU transceiver to listen for a signal. Thus, Sleep-RX-Sleep means to Sleep, wake up and use the transceiver to scan all channels for a signal and then go back to sleep if no signal detected.

When the MIU wakes from a sleep state, it will enter the channel activity detection (CAD) state. To use a metaphor, a MIU radio "channel" is similar to a TV channel. Suppose a user has a 10 channel TV. The user falls asleep, later wakes up and surfs the 10 TV channels in sequence looking for "activity", and if nothing is on, he goes back to sleep. If the user changes the TV channels in sequence (1, 2, 3, 4 . . . ), that is a direct sequence mode. If the user changes the TV changes randomly (1, 5, 8, 2, 4 . . . ), such a mode is a frequency hopping mode.

Similarly, when the MIU (250) wakes from a sleep mode, it activates the transceiver and scans all of its channels for activity (a transmitted signal). This scanning state is called the Channel Activity Detection state (CAD state). If the MIU goes through all the channels and detects no activity (i.e. no valid signal), the MIU goes back to sleep for a predefined time.

For the currently preferred embodiment, the CAD state lasts a maximum of 3 ms during which the transceiver will monitor the relevant channels for a transmitted signal indicating some device is trying to communicate with MIU (250).

Thus, the normal cycle of the MIU transceiver will be to sleep for a period, wakeup, surf each of its channels listening for channel activity, and then go back to sleep if no activity is detected. This cycle is interrupted when a signal is detected or the mode stop time is detected as described earlier.

For drive-by applications, this will generally happen one time per month, so the transmit contribution to the overall power consumption is negligible compared to the power consumption of the receiver in the Sleep-RX-Sleep cycle.

Frequency Hopping Spread Spectrum

The normal cycle of the transceiver will be to sleep for a period, wakeup through the above defined cycle, listen for channel activity, and then go back to sleep. This cycle is interrupted when a transmitter is detected.

In order to comply with regulatory standards, the FHSS version of the radio employs 25 channels with a minimum 20 dB bandwidth of 250 kHz. Therefore, the transceiver will use FSK modulation with a frequency deviation of 250 kHz peak to peak. The data rate will be 128 kbit/second for a modulation index of effectively 2.

The receiver will use 12 pre-amble bits for a valid pre-amble detection. For such parameters, the transmit time will be 93 uS. Therefore, for the FHSS version, the receiver must listen for a minimum of 93 uSec per channel to ensure a valid pre-amble detection. Each time the receiver changes channels, it requires 96 uSec for the PLL to settle on the new channel. Further, each channel requires an 189 uSec dwell time. Multiplying that by the 25 channels required by the applicable regulatory rules, we get the 4.7 mSec settling time.

The normal cycle of the transceiver will be to sleep for a period, wakeup through the above defined cycle, dwell in receive-mode for 4.5 mSec to listen to each channel for a transmitter signal, and then go back to sleep. This cycle is interrupted when a transmitter-signal is detected.

Power Consumption

The following table shows the average current consumption for both direct sequence and frequency hopping configurations for various sleep intervals and is calculated using the values presented in the previous paragraphs:

| Sleep Interval (seconds) | Average Current (uA) | |
|---|---|---|
| | Direct Sequence | Frequency Hopping |
| 1 | 30 | 72 |
| 4 | 7.5 | 18.34 |
| 10 | 3 | 7.4 |

As on can see from the table above, the direct sequence configuration provides significant power savings. If the Sleep-RX-Sleep cycle is continuously employed, the following table can be used to estimate battery life of the proposed 3V, 5.9A-H battery pack:

| | Direct Sequence | | Frequency Hopping | |
|---|---|---|---|---|
| Sleep Interval (seconds) | Battery Life (Hours) | Battery Life (Years) | Battery Life (Hours) | Battery Life (Years) |
| 1 | 196,667 | >22 years | 81,944 | 9.35 |
| 4 | 786,667 | 89 | 321,701 | 36.72 |
| 10 | 1,966,667 | 224 | 797,297 | 91 |

During the RX (RX=receiver, TX=Transmitter) scanning portion of the cycle, each channel is dwelt upon long enough to allow the frequency synthesizer to stabilize and to allow valid pre-amble detection.

Carrier detection during RX scanning is a two phase process. In the first phase, the receiver will monitor RSSI during the dwell time. If the RSSI has not exceeded the noise floor by a predefined about (e.g. 5 dB) during the dwell period, the receiver will change to the next channel and start the process over again. If a valid carrier signal is detected, the receiver will increase the dwell time to allow sufficient time to receive a valid data packet. If a valid data packet is not received during the extended dwell time, the receiver hops to the next channel. If all 25 channels are exhausted without receiving a valid data packet, the radio goes back into sleep mode. If a valid data packet is received, the application logic will behave accordingly.

Preferably, all data is encrypted using AES with a 128-bit key. So long as this key is kept secret, the communications will be secure. For the current embodiment, physical layer encryption is the preferred method of securing the wireless communications. Therefore, transmitted data is encrypted at the physical layer, protecting the MIU (250) against spoofing attacks.

Warranty Tracking

Users of MIU devices typically desire a warranty of at least 10 years with regard to replacing the MIU including battery replacement/maintenance.

As noted above, the MIU (250) device is powered by power pack (252) which can be depleted. How quickly such power pack is depleted depends on how much power is used over time by the MIU device. As noted above, the power used over time by the MIU device depends on its configuration. Also noted previously, the MIU modes of operation include: (0) Continuous sleep; (1) Active Listen; (2) Periodic Listen; (3) Bubble up. Each MIU mode will use the various transceiver modes (i.e. sleep, Ready, Tune, Receive, and Transmit) differently. Of these transceiver modes, the transmit mode and Receive mode will have the most impact on life span of the power pack. Thus, for one embodiment, warranty life is determined by the amount of time in a particular MIU mode.

For one embodiment, the MIU maintains a power counter value that is incremented each time a given unit of time passes while the MIU is in a predefined mode. For example, the unit of time may be seconds and the predefined mode(s) may be the transmit mode and the receive mode. Thus, the MIU would increment a power counter value for each second the MIU is in either transmit mode or receive mode.

The MIU would further store a Power-consumption-start-date such as the date the MIU was first put into service or powered on.

Using the power counter value and the power-consumption-start-date, the actual power consumption rate can be calculated.

Next the warranty period is established using whatever criteria desired. The warranty period is then used to establish a warranty power consumption rate. For example, if the warranty period is 10 years and the power pack (252) is rated at 5.9 A-H, then the actual power consumption rate can be no more than 0.59 A-H per year or 49 mA-H per month.

The actual power consumption rate is compared to the warranty power consumption rate. If actual power consumption is determined to be a predefined amount greater than the warranty power consumption rate, a power consumption flag is generated.

Such calculations can be performed by the either the MIU or the end user or both. Further, if a MIU power pack should fail prematurely, the warranty data can be examined to see if the MIU was being used in a configuration that caused excessive power drain. Additionally, a power consumption flag will warn a user that his MIU is using more power than expected.

For another embodiment, a coulombs counter. For such embodiment, the MIU basically meters the power flow from power pack (252) using any one of a number of equations. For one embodiment, the MIU simply monitors the amount of time a MIU is in a particular mode and multiplies the power consumption rate for such mode by the time in such mode and stores the result in as an accumulative counter value.

Controller Transceiver Modes

As noted previously, controller (280) executes software algorithms that allow the MIU modes and associated transceiver modes to change based on a MIU schedule. As a result, the MIU average power consumption can actually be considerably lower than what is shown in the above chart. For example, in a typical application, the transceiver might spend 10 hours out of the day in the Sleep-RX-Sleep cycle and 14 hours in deep sleep, increasing the battery life by a factor of 2+.

Conversely, if a user decides to utilize a custom power hungry MIU mode, the battery life can be significantly degraded. For this reason, a MIU (250) provides a warranty tracking feature described above.

In the primary operating mode (Periodic Listen), the transceiver wakes periodically to listen for a message (transmitted signal). The first stage of that process was described above. First, MIU (250) listens for a valid signal transmitted by interrogator (282). If a valid transmitted signal is detected, the MIU receiver will dwell on the channel of which the preamble was found. When the interrogator (282) finishes sending the long wake-up pre-amble, it will transmit the wakeup message to the MIU.

The wakeup message will consist of a packet start code used to ID the start and type of the packet, a list of MIU (250) serial numbers to be read, a 32-bit timing reference, and a closing CRC for data validation. The MIU (250) list and the CRC are preferably encrypted.

It should be noted that a transmitted interrogator (282) wakeup signal may be received by any number of MIU units. However, the interrogator (282) only wishes to communicate with a predefined number of meters at a time. Thus, for the preferred embodiment, the list of MIU serial numbers described above will comprise 16 serial numbers.

When the wake-up message is complete, the interrogator (282) will hop to the next channel and begin a receive period that is divided into sixteen (16) MIU-transmit-windows. The location of an MIU's serial number in the wakeup list determines which MIU-transmit-window the MIU with that serial number is to transmit on.

When the MIU (250) receives the wakeup message, it checks the list to see if it has been addressed. If not, the MIU goes back to sleep. If it has, the MIU (250) notes its MIU-transmit-window and goes to sleep until its MIU-transmit-window "opens" (i.e. its transmission time has come). At that point, the MIU tunes to the proper channel, transmits its MIU-data-signal, and goes back to sleep. Each MIU-transmit-window period (timeslot) is 20 mSec. The interrogator (282) will hop to each MIU transmit channel at a known time. Thus, the MIU can calculate which channel it needs to transmit on and when it needs to transmit.

For example, if the MIU serial number was the fourth serial number on the list of serial numbers, such MIU has been assigned the fourth MIU-transmit-window. In response, the MIU will advance its hop table by four channels and then sleep for 80 mSec (4×20 ms; MIU-transmit-window period is 20 ms for the current embodiment). When 80 mSec has expired, the interrogator (282) will be on the same channel as the MIU. The MIU will then transmit its MIU-data-signal that will be received by the interrogator (282). Notably, the MIU (250) and the interrogator (282) have the same 25 channel hop table (for frequency hopping version; direct sequence does not need a hop table). For the frequency hopping configuration, the hop table is generated using a seed and guarantees that each physical channel appears only once in the hop table. The hop table is a randomized list of the 25 physical radio channels.

In general, the controller (280) transceiver will comprise the following features: (1) Programmable transmit output power from 1 to 20 dBm in at least eight (8) discrete steps up to 1 watt; (2) Data rate of about 128 kbit/sec; (3) Frequency deviation about 250 kHz peak-to-peak; (4) Receiver sensitivity of less than or equal to 99 dBm @ data specified rate; (5) Harmonic power and Spurious power that complies with applicable regulatory requirements (e.g. 10 CFR 47 §15.247 requirements); (6) Automatic Frequency Control (AFC) that will ensure proper operation across specified temperature range.

System Operation

As noted above, the currently preferred AMR system is configured to be used in walk-by, drive-by, fixed network, and sub-metering applications and the MIU (250) is configured to support such modes of operation without hardware modifications. The different AMR-Modes are now examined in more detail. For this section of the document, the term interrogator-schedule refers to the predefined schedule for which a remote device, such as interrogator (282), will be expected to communicate with one or more MIU (250) devices to retrieve meter-data.

The Interrogator

Figure 17:
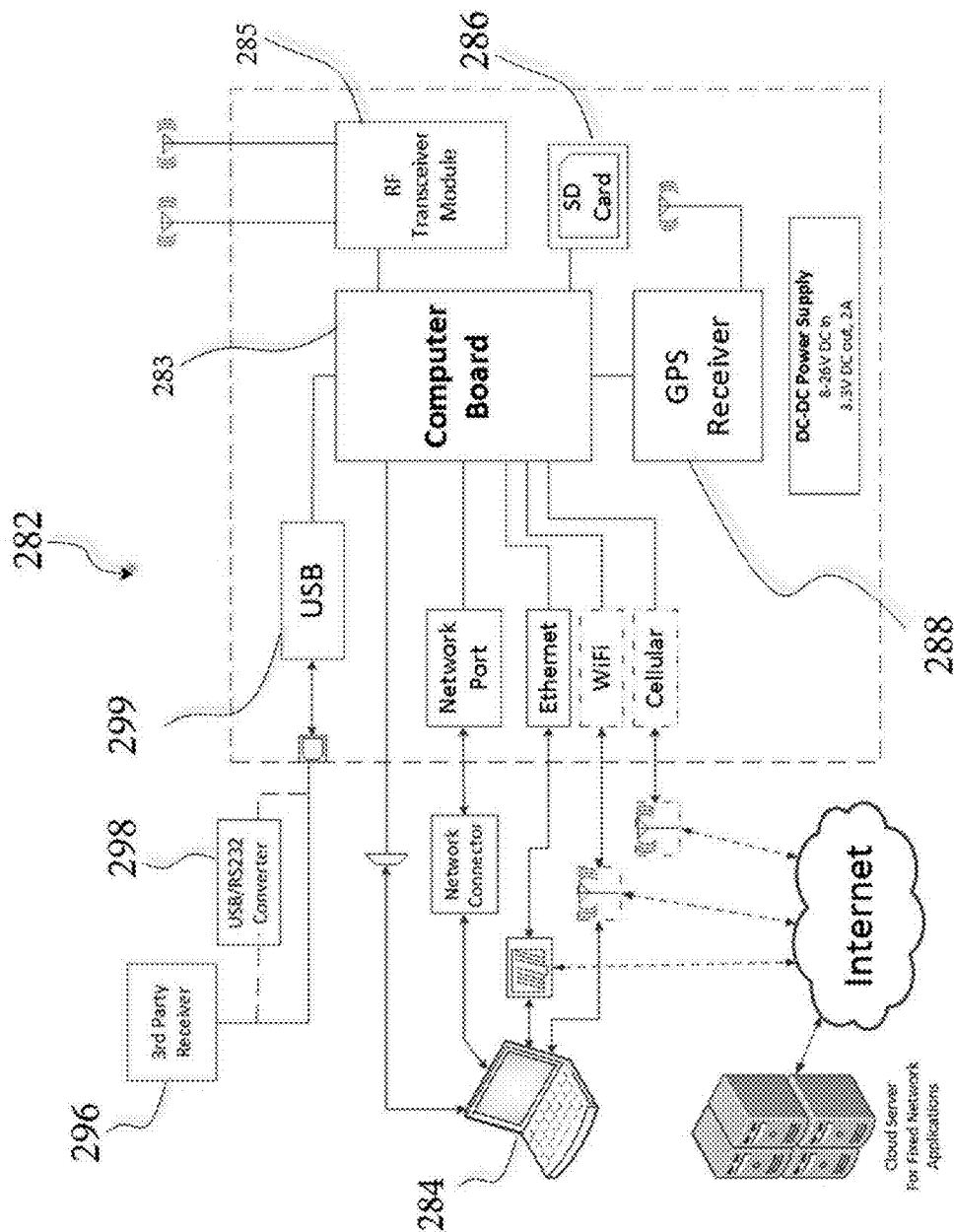
FIG. 17 is a block diagram illustration of one embodiment of an interrogator.

Referring now to FIG. 17, one exemplary embodiment of an Interrogator (282) is presented. Generally speaking, the interrogator (282) is a mobile transceiver configured for being used in a mobile vehicle. For example, a utility company employer installs an interrogator into his vehicle and drives around various neighborhoods waking up and reading utility meters (such as water meters). The interrogator (282) will be mounted in a vehicle and connected to a computing device (284) via any suitable communication technologies such as RS-232, WiFi, USB, or Bluetooth. For the preferred embodiment, interrogator (282) is based on a Single Board Computer (283) running the Linux operating system and custom application specific software written in C# and running in the Mono runtime.

The interrogator (282) has a built in removable memory (286). One embodiment of a removable memory is an SD card. Such memory serves a plurality of purposes including: (a) it stores the OS for the single board computer and the application software; (b) it stores the list of MIU devices to be read; and (c) it is used to buffer readings so that a power loss will not cause data loss.

The interrogator (282) further contains a plurality of communication interfaces and devices including: (a) GPS receiver (288)—used to establish the location of the interrogator; (b) WiFi (290) and Cellular (291)—optional interfaces used for connecting interrogator (282) to internet in fixed network applications; (c) USB/serial converter (292)—this interface makes the USB port look like a COM port on a PC and is used for direct connection to the receiver; (d) USB II (299)—these general purpose USB ports can be used to connect a 3$^{rd}$ party receiver system and legacy receiving equipment to the interrogator (282); and (e) Ethernet (294)—This interface can be used for direct connection to a laptop or the internet, depending on the application requirements.

For the currently preferred embodiment, interrogator (282) will continuously operate in a cycle of establishing its position via GPS, generating a MIU wake up list that wakes up the closest unread MIUs and collects readings from such MIU devices. If the interrogator (282) does not receive a response from a MIU on the wake up list, a predefined number of retries will be attempted. If the interrogator does not receive a response after such retries, a read failure is flagged.

At the beginning of the cycle, the interrogator (282) will use it's built in GPS receiver to establish its location-data and obtain an atomic clock based timing reference. Using the location-data, the interrogator (282) will consult a database containing MIU-location-data for unread MIUs located along the route the mobile interrogator (282) is traveling. The MIU-location-data is preferably stored on the SD card. Exemplary MIU-Location-Data includes GPS data for the MIU.

Preferably, a MIU database will be compiled from a route list generated by a utility/user. The database should contain the MIU serial number and its latitude and longitude. The interrogator (282) will have a small spatial database engine. Each cycle, the interrogator (282) will establish its location via GPS and query the database to determine the 16 closest MIU devices that have not been read. The interrogator (282) will then transmit a wakeup message with those 16 MIUs serial numbers in order from closest to farthest in the direction of travel. Once the readings are collected from such 16 MIUs, the cycle starts again.

Alternatively, the interrogator (282) can be configured to listen for bubble up transmissions from the MIUs, emulating the operation of the MKII legacy radios. In this mode, the receiver will simply forward all incoming messages to the host computer (284) via the assigned interface.

External Data Source (EDS)

The interrogator (282) is capable of acting as a communications multiplexor for external data sources (EDS). The term "External Data Source (EDS)" refers to data from 3$^{rd}$ party systems as well as legacy system. Such feature allows for simplified, continued support for legacy systems as well as data collecting services from 3$^{rd}$ party (296) systems. For example, such a 3$^{rd}$ party system could be any wireless communication system such as the AMR radios for electricity meters, gas meters, or another company's water meter. The 3$^{rd}$ party system could be a system of sensors configured to monitor any number of parameters.

Using any one of a plurality of communication interfaces, the interrogator (282) can receive messages from a 3$^{rd}$ party and legacy AMR receivers and multiplex those messages with the stream of readings coming from the interrogator (282) transceiver (285). The format and structure of the message is unimportant so long as the communication parameters are defined as such data is simply routed to computing device (284). Restated, for the preferred embodiment, the 3$^{rd}$ party and legacy messages are simply buffered and repeated without any parsing or processing.

Each EDS will be assigned a communication buffer. Such buffer stores incoming messages in a memory (such as the SD card) as the messages come in. The interrogator (282) application will monitor these buffers and, when the buffers are not empty, interrogator (282) will forward such messages to a computing device (284) via the assigned interface. If power is lost before all messages are transferred, the SD card ensures that the messages (readings) are not lost.

Drive-By Mode

For drive-by applications, the MIU (250) will generally be configured to operate in Periodic Listen mode (with a 1-4 second period) during normal working hours and in Continuous Sleep mode for the remainder of the day. Generally speaking, the MIU (250) is configured to communicate with a remote device such as interrogator (282) when in Periodic Listen mode, thus, the MIU (250) schedule needs to coincide with the interrogator-schedule defined by the system owner (i.e. the utility company). For example, if a utility employee drives by a particular MIU on Monday between 2:00 pm and 5:00 pm, the MIU should be in periodic listen mode during at least part of such time.

As previously described, in Periodic Listen mode, the MIU will wake-up at the beginning of the period, scan every channel to find a valid pre-amble, and dwell on the channel where a pre-amble is found to receive the incoming wakeup message.

The interrogator (282) will be mobile in a vehicle and connected to a computer (284) via any suitable communication interface such as RS-232, USB, or Bluetooth. The interrogator (282) will continuously operate in a cycle of establishing its position via GPS, waking up closest unread MIUs and collecting readings.

At the beginning of the cycle, the interrogator (282) will use it's built in GPS receiver to establish a location fix and to obtain an atomic clock based timing reference. Using the location fix, the Receiver will consult a database of MIUs located on the SD card. For each cycle, the interrogator (282) will establish its location via GPS, query the database for the closest unread MIUs. When interrogator (282) receives the desired data from a MIU, such MIU is flagged as having been. Interrogator (282) will then transmit a wakeup message with those 16 MIUs serial numbers in order from closest to farthest in the direction of travel. Once the readings are collected from the 16 MIUs, the cycle starts again.

Alternatively, the wakeup mechanism may be configured to work as follows. The wakeup message will contain the interrogator (282) GPS location, not the 16 MIU serial numbers. Each MIU will have its GPS location set in its configuration settings. When it receives the wakeup message, it will calculate the distance between it and the receiver. If the distance is less than a configurable threshold, the MIU will stay awake and transmit its reading after a back-off period. The back-off period will be a function of the distance to the receiver, so that closer MIUs will transmit first and farther away MIUs will transmit last.

With this approach, there is no guarantee that MIUs will not transmit over the top of each other. In order to assure reading collection, the Receiver will transmit an acknowledgement when it receives an MIU's reading transmission. If the MIU fails to receive the acknowledgement, it will attempt to resend the packet several times. The number of re-transmissions is configurable.

Fixed Network/Sub Metering

In a fixed network application, the MIU (250) operates the same as it does in the drive-by application. The interrogator (282), however, is not mobile but remains in a fixed location.

The interrogator (282) maintains a list of MIUs in the network. This can either be stored on the SD card or can be sent to the interrogator (282) by the host computing device. At prescribed intervals, the interrogator (282) will divide the list of MIU devices into a plurality of groups with each group comprising 16 MIU devices. The interrogator (282) will wake up each group in sequence and collect readings until all MIUs have been interrogated. The interrogation interval is configurable from 15 minutes to 24 hours.

The interrogator (282) can be configured to send the readings to a host computing device through a direct connection via Bluetooth, USB, or RS-232. It can also be configured to send the readings to a remote host through a network connection using Ethernet, WiFi, or cellular. The IP address of the host is configurable, allowing the data to transverse the Internet or remain in a local network.

When the interrogator (282) is configured to transmit readings to a remote host over a network connection, the SD card will be used to buffer readings. This will ensure that readings are not lost if the network connection temporarily goes down. In addition, the interrogator (282) can be programmed to log the readings to the SD card as a back-up mechanism.

Diagnostics

Diagnostic mode is entered by sending the interrogator (282) a specific command via one of the local ports. The diagnostic command will include the serial number of an MIU. When the interrogator (282) enters this mode, it attempts to connect with the appropriate MIU (250) device. As noted above, for one embodiment, the MIU is placed in the configuration mode using a magnet to engage magnetic element (270) after the MIU has been powered up.

The method for placing the MIU (250) into diagnostics mode can depend on the state of the MIU (250). If the current mode is Continuous Sleep or Periodic Transmit, the MIU (250) the diagnostic mode is activated using magnetic element (270). Such a feature is particularly useful if a MIU device is stuck in sleep mode. If the MIU's current mode is either of the two listen modes, the radio can be woken up remotely by the interrogator (282) by a special command. Such command may or may not include a password as described previously.

Once communications between the MIU and interrogator (282) is established, the interrogator (282) acts like a transparent pipe between the host computing device and the MIU. Any bytes sent to the interrogator (282) by the host computing device are forwarded to the MIU. Any bytes sent by the MIU to the interrogator (282) are forwarded to the host computing device. The protocol used to accomplish diagnostics is managed in the host computing device's upgrade application and the MIU's firmware.

The upgrade application will provide four basic groups of functionality: configuration, data retrieval, firmware upgrade, and diagnostics.

All MIU configuration settings can be set and changed in the Windows application. These settings are sent to the MIU at the click of a button. The configuration settings are contained in a grid and comprise a dictionary of key-value pairs with the key being the setting name and the value being the setting value.

The data retrieval tab will provide buttons for retrieving the data log and the event log from the MIU. The data from these logs will be saved to a user specified file. In addition, editors will be provided on the tab sheet that will allow the user to view the data.

The programming tab will provide a button for downloading new firmware to the MIU. When the button is clicked, the user will be prompted to select a firmware file. The file will be verified and then downloaded to the MIU. The MIU will buffer the new firmware to its non-volatile memory. When the entire file is received, the MIU will validate the file by comparing the hash it received with the one it calculates. If the file verifies, the MIU will reprogram its own flash. Once the reprogramming is complete, the diagnostic connection will be lost and the connection process will have to be restarted to reestablish the diagnostic mode.

The diagnostic tab will give the user various tools for testing the MIU. These will include the ability to set the mode of the transceiver along with the channel, power output, and so on. They will also include the ability to turn on and off the charge pump voltage source and the ability to monitor in near real time the status of the register interface to allow it to be tested with a test fixture.

When the diagnostic Windows application starts, the tab sheets will be disabled. A connection toolbar will be located at the top of the screen. The user will have to enter a technician number (for tracking who did what), a MIU serial number, and a password. He will then press the "Connect" button on the toolbar and the connection process will start. When the connection is established, the tab sheet will be enabled and the user will be able to use the various tools it provides. This individual method of updating the MIU must be initiated by swiping the magnet over the internal reed switch of the target MIU and will not change the AES encryption key from the primary one.

If the user enters his user name and password without entering a MIU serial number, and if his user name has sufficient rights, a fifth tab will appear that will allow the user to do bulk updates. The user can provide a list of serial numbers to modify. Once the list has been provided, the user can specify whether to load new firmware, new schedules, or both. Once the process is started, each serial number will be highlighted when it is complete.

Each time the user does something with the diagnostic program that changes the state of a MIU, the event log is updated with the action, a timestamp, and the technician ID. This information provides an audit trail allowing future analysis of what changes were made and by who when problems arise with the device.

By providing this method of updating the MIU, security concern is introduced. To prevent malicious access to the MIU in general, 256-bit AES encryption is employed on all data communicated back and forth. When an MIU is placed in Diagnostic mode by a receiver (Multiple modes) instead of the magnet, it will change its key to a secondary key that is specific to the utility. This key will be tied to the user password so that the receiver cannot be given the new key unless the proper password is entered into the Windows computer. This is all completely transparent to the vendor and the customer.

If the MIU is placed in multiple diagnostic modes and no further communication is received within 10 minutes, it will revert to its scheduled mode and primary AES encryption key.

When the MIU ships from the factory both of the keys will be identical. The diagnostic key can be changed when the MIU is provisioned to achieve the added security.

While the present subject matter has been described in detail with respect to specific embodiments thereof, it will be appreciated that those skilled in the art, upon attaining an understanding of the foregoing may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. A universal meter interface unit (MIU) configured for transmitting utility data, said meter interface unit comprising:
   a MIU housing suitably configured for housing MIU components;
   a controller associated with a memory and disposed inside said MIU housing wherein said controller is one of (a) electrically associated with a transceiver and (b) configured with an on chip transceiver wherein said transceiver is electrically associated with an antenna that is one of (a) disposed at least partially inside said MIU housing and (b) external to said MIU housing;
   a register interface configured for being electrically associated with an external data source via at least one of (a) a wired interface and (b) a wireless interface and wherein said register interface is further electrically associated with said controller and wherein said controller is configured to use said register interface to retrieve device-data from said external data source according to a predefined schedule;
   a power pack that is one of (a) disposed inside said MIU housing and (b) disposed within a power pack housing configured for being removably mechanically associated with said MIU housing wherein said power pack is suitably configured for supplying power to said MIU components including at least two of said controller, said transceiver and said register interface;
   wherein said controller is configured to execute any one of a plurality of MIU modes without hardwire modifications and according to a MIU mode schedule wherein at least one MIU mode is configured for drive-by interrogations and at least one MIU mode is configured for fixed network interrogations;
   wherein said MIU mode schedule comprises the MIU mode that is to become active;
   wherein said controller is configured to generate MIU-data stored in event logs comprising information about the status of the MIU; and
   wherein said controller is further configured to program said transceiver to transmit a MIU-data-signal comprising at least one of (a) MIU-data and (b) at least part of said device-data.

2. A universal meter interface unit (MIU) as in claim 1, wherein the output power of said transceiver is programmable and wherein said MIU mode defines a transmit power value and, wherein said controller is configured to use said transmit power value to program said transceiver to transmit said MIU-data signal.

3. A universal meter interface unit (MIU) as in claim 2, wherein said plurality of MIU modes comprises a continuous sleep mode, an active listen mode, a periodic listen mode, and periodic transmit mode.

4. A universal meter interface unit (MIU) as in claim 3, wherein said MIU is configured to activate a drive-by mode during a first period of a day and wherein said MIU is configured to activate a fixed network mode during a second period of said day without hardware modification.

5. A universal meter interface unit (MIU) as in claim 1, wherein said register interface is configured to read pulse registers and digitally encoded registers without hardware modification.

6. A universal meter interface unit (MIU) as in claim 1, wherein said controller is further electrically associated with a magnetically activated configuration interface comprising a magnetic component wherein said magnetic component blocks power from said magnetically activated configuration interface when not actuated and wherein said magnetically activated configuration interface is configured to generate a configuration signal when said magnetic component is actuated thereby signaling said MIU to enter configuration mode.

7. A universal meter interface unit (MIU) as in claim 6, wherein said power pack is electrically isolated from said MIU components by said magnetic component when the battery pack is first connected to said MIU components.

8. A universal meter interface unit (MIU) as in claim 7, wherein a latching component is electrically associated with said controller and wherein said latching component bypasses said magnetic component when activated and wherein said controller is configured to activate said latching component when said magnetic component is activated thereby latching power on.

9. A universal meter interface unit (MIU) as in claim 7, wherein said magnetic element further provides a magnetic security feature preventing remote configuration of the MIU when the magnetic element is not actuated.

10. A universal meter interface unit (MIU) as in claim 7, further comprising at least two sensors electrically associated with said controller wherein said at least two sensors comprise at least two of: temperature, GPS, acceleration, water, electromagnetic interface (EMI), and light sensor.

11. A universal meter interface unit (MIU) as in claim 1, wherein said controller is configured to track warranty information based on power consumption.

12. A universal meter interface unit (MIU) as in claim 1, wherein said controller is configured to track the power consumption rate of the MIU and issue a power consumption rate warning when the measured power consumption rate meets predefined power consumption threshold warning data stored in memory.

13. A universal interrogator configured for interrogating remote devices, said universal interrogator comprising:
   a computing device electrically associated with a transceiver electrically associated with an antenna, a GPS receiver, a non-volatile memory and at least one communication port configured for transferring data between the computing device and a remote-computing-device;
   wherein the universal interrogator is powered by at least one of an external and internal power source;
   wherein said computing device is configured to use said GPS receiver to determine interrogator-location-data representing the current location of the interrogator;
   wherein said computing device is further configured to access MIU-location-data and determine the MIU ID number for the MIU devices closest to said interrogator for a predefined MIU-number of MIU devices;
   wherein said MIU-location-data is one of (a) stored in a local memory and (b) stored in a remote memory;
   wherein said computing device is further configured to use said transceiver to transmit a MIU wakeup signal comprising said MIU ID numbers; and
   wherein said computing device is further configured to use said transceiver to detect a MIU transmitted response signal.

14. A universal interrogator as in claim 12, wherein said predefined MIU-number is 16.

15. A universal interrogator as in claim 12, further comprising at least one third party interface configured for receiving data from a third party receiver system electrically associated with said third party interface.

16. A universal interrogator as in claim 13, further comprising a plurality of third party interfaces and wherein said computing device is configured to assign a memory buffer to each third party interface and store date received over such each third party interface in its respective buffer and transfer said data to said remote-computing-device as required to prevent buffer overflow.

\* \* \* \* \*